(12) United States Patent
Gupta et al.

(10) Patent No.: US 12,157,945 B2
(45) Date of Patent: Dec. 3, 2024

(54) THERMAL ATOMIC LAYER DEPOSITION OF SILICON-CONTAINING FILMS

(71) Applicant: Lam Research Corporation, Fremont, CA (US)

(72) Inventors: Awnish Gupta, Hillsboro, OR (US); Tengfei Miao, Beaverton, OR (US); Adrien Lavoie, Newberg, OR (US); Douglas Walter Agnew, Portland, OR (US); Ian John Curtin, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/632,074

(22) PCT Filed: Jul. 24, 2020

(86) PCT No.: PCT/US2020/043459
§ 371 (c)(1),
(2) Date: Feb. 1, 2022

(87) PCT Pub. No.: WO2021/025874
PCT Pub. Date: Feb. 11, 2021

(65) Prior Publication Data
US 2022/0275510 A1 Sep. 1, 2022

Related U.S. Application Data

(60) Provisional application No. 62/883,556, filed on Aug. 6, 2019.

(51) Int. Cl.
*C23C 16/455* (2006.01)
*C23C 16/30* (2006.01)
(Continued)

(52) U.S. Cl.
CPC ...... *C23C 16/45542* (2013.01); *C23C 16/308* (2013.01); *C23C 16/402* (2013.01); *C23C 16/45534* (2013.01); *C23C 16/46* (2013.01)

(58) Field of Classification Search
CPC ............ C23C 16/45542; C23C 16/308; C23C 16/402; C23C 16/45534; C23C 16/46;
(Continued)

(56) References Cited

U.S. PATENT DOCUMENTS 4,158,717 A 6/1979 Nelson
4,419,809 A 12/1983 Riseman et al.
(Continued)

FOREIGN PATENT DOCUMENTS

CN 1732288 A 2/2006
CN 1841676 A 10/2006
(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.
(Continued)

*Primary Examiner* — Michael G Miller
(74) *Attorney, Agent, or Firm* — Weaver Austin Villeneuve & Sampson LLP

(57) ABSTRACT

Silicon oxide, silicon nitride, and silicon oxynitride films may be deposited by thermal atomic layer deposition (thermal ALD) in a single wafer plasma reactor. The single wafer plasma reactor can perform thermal ALD and plasma-enhanced atomic layer deposition (PEALD). Highly conformal films may be deposited at a high deposition rate without damaging or with minimal damage to the substrate using thermal ALD. The substrate may be heated at an elevated temperature during oxidation and/or nitridation. In some
(Continued)

implementations, the elevated temperature is between about 500 C and about 750 C. In some implementations, hydrogen and oxygen may be flowed as reactant gases during oxidation, where the hydrogen and oxygen may react in an exothermic reaction to drive formation of oxide.

21 Claims, 14 Drawing Sheets

(51) Int. Cl.
C23C 16/40 (2006.01)
C23C 16/46 (2006.01)

(58) Field of Classification Search
CPC ............ C23C 16/045; C23C 16/45531; C23C 16/401; C23C 16/50; C23C 16/45525; C23C 16/52; C23C 16/56; C23C 16/505
See application file for complete search history.

(56) References Cited

U.S. PATENT DOCUMENTS

| | | | |
|---|---|---|---|
| 4,500,563 A | 2/1985 | Ellenberger et al. | |
| 4,575,921 A | 3/1986 | Bhagat | |
| 4,869,781 A | 9/1989 | Euen et al. | |
| 5,091,332 A | 2/1992 | Bohr et al. | |
| 5,202,272 A | 4/1993 | Hsieh et al. | |
| 5,230,929 A | 7/1993 | Caporiccio et al. | |
| 5,314,724 A | 5/1994 | Tsukune et al. | |
| 5,459,099 A | 10/1995 | Hsu | |
| 5,496,608 A | 3/1996 | Matsuda et al. | |
| 5,528,719 A | 6/1996 | Yamada | |
| 5,670,432 A | 9/1997 | Tsai | |
| 5,731,235 A | 3/1998 | Srinivasan et al. | |
| 5,854,105 A | 12/1998 | Tseng | |
| 5,856,003 A | 1/1999 | Chiu | |
| 5,891,805 A | 4/1999 | Cheng et al. | |
| 5,976,990 A | 11/1999 | Mercaldi et al. | |
| 6,039,834 A | 3/2000 | Tanaka et al. | |
| 6,080,676 A | 6/2000 | Nguyen et al. | |
| 6,153,519 A | 11/2000 | Jain et al. | |
| 6,197,701 B1 | 3/2001 | Shue et al. | |
| 6,225,175 B1 | 5/2001 | Houston | |
| 6,228,779 B1 | 5/2001 | Bloom et al. | |
| 6,326,322 B1 | 12/2001 | Kim et al. | |
| 6,380,056 B1 | 4/2002 | Shue et al. | |
| 6,395,652 B2 | 5/2002 | Kim et al. | |
| 6,403,416 B1 | 6/2002 | Huang et al. | |
| 6,416,822 B1 | 7/2002 | Chiang et al. | |
| 6,428,859 B1 | 8/2002 | Chiang et al. | |
| 6,448,192 B1 | 9/2002 | Kaushik | |
| 6,518,167 B1 | 2/2003 | You et al. | |
| 6,534,395 B2 | 3/2003 | Werkhoven et al. | |
| 6,548,368 B1 | 4/2003 | Narwankar et al. | |
| 6,632,478 B2 | 10/2003 | Gaillard et al. | |
| 6,632,741 B1 | 10/2003 | Clevenger et al. | |
| 6,638,879 B2 | 10/2003 | Hsieh et al. | |
| 6,645,574 B1 | 11/2003 | Lee et al. | |
| 6,709,928 B1 | 3/2004 | Jenne et al. | |
| 6,730,614 B1 | 5/2004 | Lim et al. | |
| 6,794,284 B2 | 9/2004 | Vaartstra | |
| 6,926,798 B2 | 8/2005 | Biberger et al. | |
| 6,933,245 B2 | 8/2005 | Lee et al. | |
| 6,967,159 B2 | 11/2005 | Vaartstra | |
| 7,019,159 B2 | 3/2006 | Dussarrat et al. | |
| 7,041,335 B2 | 5/2006 | Chung | |
| 7,169,704 B2 | 1/2007 | Koo et al. | |
| 7,172,792 B2 | 2/2007 | Wang et al. | |
| 7,211,525 B1 | 5/2007 | Shanker et al. | |
| 7,297,641 B2 | 11/2007 | Todd et al. | |
| 7,300,885 B2 | 11/2007 | Hasebe et al. | |
| 7,301,210 B2 | 11/2007 | Abadeer et al. | |
| 7,351,668 B2 | 4/2008 | Chou et al. | |
| 7,462,571 B2 | 12/2008 | Hasebe et al. | |
| 7,465,669 B2 | 12/2008 | Iyer et al. | |
| 7,482,247 B1 | 1/2009 | Papasouliotis et al. | |
| 7,507,676 B2 | 3/2009 | Chou et al. | |
| 7,510,984 B2 | 3/2009 | Saito et al. | |
| 7,514,366 B2 | 4/2009 | Trivedi et al. | |
| 7,611,980 B2 | 11/2009 | Wells et al. | |
| 7,622,369 B1 | 11/2009 | Lee et al. | |
| 7,625,820 B1 | 12/2009 | Papasouliotis et al. | |
| 7,629,267 B2 | 12/2009 | Wan et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,700,492 B2 | 4/2010 | Kikuchi | |
| 7,713,592 B2 | 5/2010 | Nguyen et al. | |
| 7,732,343 B2 | 6/2010 | Niroomand et al. | |
| 7,758,920 B2 | 7/2010 | Hasebe et al. | |
| 7,790,633 B1 | 9/2010 | Tarafdar et al. | |
| 7,807,578 B2 | 10/2010 | Bencher et al. | |
| 7,825,039 B2 | 11/2010 | Takahashi et al. | |
| 7,910,288 B2 | 3/2011 | Abatchev et al. | |
| 7,910,497 B2 | 3/2011 | Olsen et al. | |
| 7,919,416 B2 | 4/2011 | Lee et al. | |
| 7,939,455 B2 | 5/2011 | Clark | |
| 7,964,241 B2 | 6/2011 | Hasebe et al. | |
| 7,964,513 B2 | 6/2011 | Todd et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,084,088 B2 | 12/2011 | Huy et al. | |
| 8,105,901 B2 | 1/2012 | Cheng et al. | |
| 8,119,544 B2 | 2/2012 | Hasebe et al. | |
| 8,129,555 B2 | 3/2012 | Cheng et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,298,628 B2 | 10/2012 | Yang et al. | |
| 8,298,954 B1 | 10/2012 | Arnold et al. | |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,580,699 B2 | 11/2013 | Mallick | |
| 8,592,328 B2 | 11/2013 | Hausmann et al. | |
| 8,623,770 B1 | 1/2014 | Gao et al. | |
| 8,669,185 B2 | 3/2014 | Onizawa et al. | |
| 8,703,578 B2 | 4/2014 | Hoentschel et al. | |
| 8,728,955 B2 | 5/2014 | Lavoie et al. | |
| 8,728,956 B2 | 5/2014 | Lavoie et al. | |
| 8,753,984 B2 | 6/2014 | Murakami et al. | |
| 8,791,034 B2 | 7/2014 | Shealy et al. | |
| 8,802,882 B2 | 8/2014 | Wang et al. | |
| 8,846,484 B2 | 9/2014 | Lee et al. | |
| 8,936,977 B2 | 1/2015 | Hoentschel et al. | |
| 8,975,704 B2 | 3/2015 | Hoentschel et al. | |
| 9,023,693 B1 | 5/2015 | Lin et al. | |
| 9,023,737 B2 | 5/2015 | Beynet et al. | |
| 9,070,555 B2 | 6/2015 | Hausmann et al. | |
| 9,095,869 B2 | 8/2015 | Kilpi et al. | |
| 9,214,333 B1 | 12/2015 | Sims et al. | |
| 9,355,839 B2 | 5/2016 | Swaminathan et al. | |
| 9,379,210 B2 | 6/2016 | Mountsier et al. | |
| 9,390,909 B2 | 7/2016 | Pasquale et al. | |
| 9,406,693 B1 | 8/2016 | Pang et al. | |
| 9,443,731 B1 | 9/2016 | O'Meara et al. | |
| 9,472,506 B2 | 10/2016 | Conklin et al. | |
| 9,502,234 B2 | 11/2016 | Xiao et al. | |
| 9,502,238 B2 | 11/2016 | Danek et al. | |
| 9,508,604 B1 | 11/2016 | Sung et al. | |
| 9,530,663 B1 | 12/2016 | Shih et al. | |
| 9,564,312 B2 | 2/2017 | Henri et al. | |
| 9,576,817 B1 | 2/2017 | Cheng et al. | |
| 9,589,790 B2 | 3/2017 | Henri et al. | |
| 9,601,693 B1 | 3/2017 | Henri et al. | |
| 9,611,544 B2 | 4/2017 | Lavoie et al. | |
| 9,670,579 B2 | 6/2017 | Hausmann et al. | |
| 9,721,784 B2 | 8/2017 | Behera et al. | |
| 9,865,815 B2 | 1/2018 | Hausmann | |
| 9,875,891 B2 | 1/2018 | Henri et al. | |
| 9,892,933 B2 | 2/2018 | Peng et al. | |

(56) References Cited

U.S. PATENT DOCUMENTS

| | | |
|---|---|---|
| 9,905,415 B2 | 2/2018 | Chandra et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann |
| 10,269,559 B2 | 4/2019 | Abel et al. |
| 10,410,872 B2 | 9/2019 | Cheng et al. |
| 10,454,029 B2 | 10/2019 | McKerrow et al. |
| 10,559,465 B2 | 2/2020 | Cheng et al. |
| 10,629,435 B2 | 4/2020 | Swaminathan et al. |
| 10,658,172 B2 | 5/2020 | Abel et al. |
| 10,804,099 B2 | 10/2020 | Henri et al. |
| 10,832,908 B2 | 11/2020 | LaVoie |
| 2001/0028922 A1 | 10/2001 | Sandhu |
| 2002/0001889 A1 | 1/2002 | Kim et al. |
| 2002/0001929 A1 | 1/2002 | Biberger et al. |
| 2002/0068466 A1 | 6/2002 | Lee et al. |
| 2003/0034244 A1 | 2/2003 | Yasar et al. |
| 2003/0092280 A1 | 5/2003 | Lee et al. |
| 2003/0116421 A1 | 6/2003 | Xu et al. |
| 2003/0143841 A1 | 7/2003 | Yang et al. |
| 2004/0043570 A1 | 3/2004 | Fujisaki et al. |
| 2004/0077184 A1 | 4/2004 | Anderson et al. |
| 2004/0096582 A1 | 5/2004 | Wang et al. |
| 2005/0025885 A1 | 2/2005 | McSwiney et al. |
| 2005/0042865 A1 | 2/2005 | Cabral, Jr. et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0123690 A1 | 6/2005 | Derderian et al. |
| 2005/0142878 A1 | 6/2005 | Jung |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |
| 2006/0008656 A1 | 1/2006 | Veerasamy |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0199357 A1 | 9/2006 | Wan et al. |
| 2006/0263699 A1 | 11/2006 | Abatchev et al. |
| 2006/0273456 A1 | 12/2006 | Sant et al. |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0099431 A1 | 5/2007 | Li |
| 2007/0137572 A1 | 6/2007 | Matsuura et al. |
| 2007/0148350 A1 | 6/2007 | Rahtu et al. |
| 2007/0148968 A1 | 6/2007 | Kwon et al. |
| 2007/0167028 A1 | 7/2007 | Chou et al. |
| 2007/0190782 A1 | 8/2007 | Park |
| 2007/0212850 A1 | 9/2007 | Ingle et al. |
| 2007/0218661 A1 | 9/2007 | Shroff et al. |
| 2007/0238299 A1 | 10/2007 | Niroomand et al. |
| 2007/0238301 A1 | 10/2007 | Cabral et al. |
| 2007/0238316 A1 | 10/2007 | Ohashi |
| 2007/0251444 A1 | 11/2007 | Gros-Jean et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0035665 A1 | 2/2009 | Tran |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | Van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0159673 A1 | 6/2011 | Hanawa et al. |
| 2011/0176967 A1 | 7/2011 | Okuda et al. |
| 2011/0183528 A1 | 7/2011 | Wang et al. |
| 2011/0223769 A1 | 9/2011 | Ko et al. |
| 2011/0244142 A1 | 10/2011 | Cheng et al. |
| 2011/0256734 A1 | 10/2011 | Hausmann et al. |
| 2011/0262642 A1 | 10/2011 | Xiao et al. |
| 2012/0009802 A1 | 1/2012 | Lavoie et al. |
| 2012/0009803 A1 | 1/2012 | Jung et al. |
| 2012/0011889 A1 | 1/2012 | Bogdahn et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0088369 A1 | 4/2012 | Weidman et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1 | 7/2012 | Hwang |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0129940 A1 | 5/2013 | Xiao et al. |
| 2013/0189845 A1 | 7/2013 | Kim et al. |
| 2013/0189854 A1 | 7/2013 | Hausmann et al. |
| 2013/0196082 A1 | 8/2013 | Spence et al. |
| 2013/0200384 A1 | 8/2013 | Mieno |
| 2013/0210236 A1 | 8/2013 | Ogihara et al. |
| 2013/0252437 A1 | 9/2013 | Sano et al. |
| 2013/0273704 A1 | 10/2013 | Jee et al. |
| 2013/0302980 A1 | 11/2013 | Chandrashekar et al. |
| 2013/0327636 A1 | 12/2013 | Majetich et al. |
| 2013/0344248 A1 | 12/2013 | Clark |
| 2014/0023794 A1 | 1/2014 | Mahajani et al. |
| 2014/0113455 A1 | 4/2014 | Reimer et al. |

(56) References Cited

U.S. PATENT DOCUMENTS

| | | |
|---|---|---|
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0158580 A1 | 6/2014 | Xiao et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0132965 A1 | 5/2015 | Devilliers et al. |
| 2015/0137061 A1 | 5/2015 | Donghi et al. |
| 2015/0155198 A1 | 6/2015 | Tsai et al. |
| 2015/0162416 A1 | 6/2015 | Chang et al. |
| 2015/0167163 A1 | 6/2015 | Kubota et al. |
| 2015/0200110 A1 | 7/2015 | Li et al. |
| 2015/0243708 A1 | 8/2015 | Ravasio |
| 2015/0249153 A1 | 9/2015 | Morin et al. |
| 2015/0251917 A1 | 9/2015 | Hong et al. |
| 2015/0259791 A1 | 9/2015 | Hausmann et al. |
| 2016/0020092 A1 | 1/2016 | Kang et al. |
| 2016/0042950 A1 | 2/2016 | Dai et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1 | 4/2016 | Yan et al. |
| 2016/0109804 A1 | 4/2016 | Huli |
| 2016/0111297 A1 | 4/2016 | Chen et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0172194 A1 | 6/2016 | Kunnen et al. |
| 2016/0190008 A1 | 6/2016 | Chandrashekar et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0254171 A1 | 9/2016 | Shamma et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0329238 A1 | 11/2016 | Tang et al. |
| 2016/0336178 A1 | 11/2016 | Swaminathan et al. |
| 2016/0336187 A1 | 11/2016 | Liou et al. |
| 2016/0343580 A1 | 11/2016 | Hudson |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092496 A1 | 3/2017 | Devilliers |
| 2017/0092857 A1 | 3/2017 | Hausmann |
| 2017/0110550 A1 | 4/2017 | Tsai et al. |
| 2017/0117134 A1 | 4/2017 | Henri et al. |
| 2017/0148637 A1 | 5/2017 | Devilliers |
| 2017/0170015 A1 | 6/2017 | Kim et al. |
| 2017/0170026 A1 | 6/2017 | Hudson et al. |
| 2017/0207082 A1 | 7/2017 | Wang et al. |
| 2017/0323785 A1 | 11/2017 | Singhal et al. |
| 2017/0323803 A1 | 11/2017 | Van Schravendijk et al. |
| 2017/0358450 A1 | 12/2017 | Ko et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala et al. |
| 2018/0076023 A1 | 3/2018 | Yan et al. |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0223429 A1* | 8/2018 | Fukazawa ......... C23C 16/45565 |
| 2018/0308695 A1 | 10/2018 | LaVoie et al. |
| 2019/0027362 A1 | 1/2019 | Cheng et al. |
| 2019/0041756 A1 | 2/2019 | Hasebe et al. |
| 2019/0055645 A1 | 2/2019 | Li et al. |
| 2019/0080903 A1 | 3/2019 | Abel et al. |
| 2019/0206677 A1 | 7/2019 | Abel et al. |
| 2019/0279866 A1 | 9/2019 | Pore |
| 2019/0284694 A1 | 9/2019 | Knisley et al. |
| 2019/0333753 A1 | 10/2019 | Ueda et al. |
| 2020/0105509 A1 | 4/2020 | Drewery et al. |
| 2020/0227314 A1 | 7/2020 | Kim et al. |
| 2021/0301400 A1 | 9/2021 | Lee et al. |
| 2023/0220544 A1 | 7/2023 | Gupta et al. |
| 2023/0317449 A1 | 10/2023 | Gupta et al. |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 101506955 A | 8/2009 |
| CN | 101981225 A | 2/2011 |
| CN | 102224573 A | 10/2011 |
| CN | 102471885 A | 5/2012 |
| CN | 102479672 A | 5/2012 |
| CN | 102906305 A | 1/2013 |
| CN | 103168344 A | 6/2013 |
| CN | 103225071 A | 7/2013 |
| CN | 103403847 A | 11/2013 |
| CN | 103515197 A | 1/2014 |
| CN | 103632955 A | 3/2014 |
| CN | 103635605 A | 3/2014 |
| CN | 103918068 A | 7/2014 |
| CN | 104046955 A | 9/2014 |
| CN | 104272441 A | 1/2015 |
| CN | 104517892 A | 4/2015 |
| CN | 104576506 A | 4/2015 |
| CN | 104752199 A | 7/2015 |
| CN | 105448701 A | 3/2016 |
| CN | 205164805 U | 4/2016 |
| CN | 105609471 A | 5/2016 |
| CN | 105789027 A | 7/2016 |
| CN | 105917445 A | 8/2016 |
| CN | 105977141 A | 9/2016 |
| CN | 106057637 A | 10/2016 |
| CN | 106449360 A | 2/2017 |
| CN | 108411281 A | 8/2018 |
| CN | 109791875 A | 5/2019 |
| EP | 0277766 A2 | 8/1988 |
| EP | 2278046 A1 | 1/2011 |
| GB | 1181559 A | 2/1970 |
| JP | 2005011904 A | 1/2005 |
| JP | 2005136300 A | 5/2005 |
| JP | 2005163084 A | 6/2005 |
| JP | 2005210076 A | 8/2005 |
| JP | 2006060091 A | 3/2006 |
| JP | 2006080359 A | 3/2006 |
| JP | 2007281181 A | 10/2007 |
| JP | 2008517479 A | 5/2008 |
| JP | 2008306093 A | 12/2008 |
| JP | 2009010318 A | 1/2009 |
| JP | 2009170823 A | 7/2009 |
| JP | 2010010497 A | 1/2010 |
| JP | 2010087187 A | 4/2010 |
| JP | 2010527138 A | 8/2010 |
| JP | 2010232214 A | 10/2010 |
| JP | 2010239103 A | 10/2010 |
| JP | 2010283388 A | 12/2010 |
| JP | 2011192776 A | 9/2011 |
| JP | 2012084707 A | 4/2012 |
| JP | 2012142574 A | 7/2012 |

(56) References Cited

FOREIGN PATENT DOCUMENTS

| JP | 2012169408 A | 9/2012 |
|---|---|---|
| JP | 5225081 B2 | 7/2013 |
| JP | 2013153164 A | 8/2013 |
| JP | 2013182951 A | 9/2013 |
| JP | 2013225655 A | 10/2013 |
| JP | 2014038968 A | 2/2014 |
| JP | 2014179607 A | 9/2014 |
| JP | 2014532304 A | 12/2014 |
| JP | 2015029097 A | 2/2015 |
| JP | 2015512568 A | 4/2015 |
| JP | 2015159335 A | 9/2015 |
| KR | 20010075177 A | 8/2001 |
| KR | 20060023137 A | 3/2006 |
| KR | 100861851 B1 | 10/2008 |
| KR | 20090080019 A | 7/2009 |
| KR | 20090131821 A | 12/2009 |
| KR | 20100027062 A | 3/2010 |
| KR | 20100128863 A | 12/2010 |
| KR | 20120098448 A | 9/2012 |
| KR | 20130062256 A | 6/2013 |
| KR | 20130135087 A | 12/2013 |
| KR | 20140069326 A | 6/2014 |
| KR | 20140079431 A | 6/2014 |
| KR | 20140126241 A | 10/2014 |
| KR | 20140141686 A | 12/2014 |
| KR | 20150025224 A | 3/2015 |
| KR | 20150053253 A | 5/2015 |
| KR | 20150103642 A | 9/2015 |
| KR | 20160033057 A | 3/2016 |
| KR | 20160045527 A | 4/2016 |
| KR | 101884555 B1 | 8/2018 |
| KR | 20210014483 A | 2/2021 |
| KR | 102407031 B1 | 6/2022 |
| TW | 483103 B | 4/2002 |
| TW | 201033739 A | 9/2010 |
| TW | 201430951 A | 8/2014 |
| TW | 201439105 A | 10/2014 |
| TW | 201606855 A | 2/2016 |
| WO | WO-2006018441 A1 | 2/2006 |
| WO | WO-2006026350 A2 | 3/2006 |
| WO | WO-2011130397 A2 | 10/2011 |
| WO | WO-2012061593 A2 | 5/2012 |
| WO | WO-2013043330 A1 | 3/2013 |
| WO | WO-2013066667 A1 | 5/2013 |
| WO | WO-2013137115 A1 | 9/2013 |
| WO | WO-2013148880 A1 | 10/2013 |
| WO | WO-2014030393 A1 | 2/2014 |
| WO | WO-2020131635 A1 | 6/2020 |
| WO | WO-2021025874 A1 | 2/2021 |

OTHER PUBLICATIONS

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
Chinese First Office Action dated Apr. 12, 2021 issued in Application No. CN 201711112653.9.
Chinese First Office Action dated Jul. 31, 2020 issued in Application No. CN 201710636255.0.
Chinese First Office Action dated Jun. 23, 2020 issued in Application No. CN 201811075877.1.
Chinese First Office Action dated Mar. 30, 2018 issued in Application No. CN 201610206201.6.
Chinese First Office Action dated May 19, 2016 issued in Application No. CN 201310021460.8.
Chinese First Office Action dated Nov. 13, 2020 issued in Application No. CN 201710772400.8.
Chinese First Office Action dated Nov. 8, 2017 issued in Application No. CN 201510615853.0.
Chinese Fourt Office Action dated May 16, 2018 issued in Application No. CN 201310021460.8.
Chinese Notification of Reexamination dated Apr. 17, 2020 issued in Application No. CN 201310021460.8.
Chinese Second Office Action dated Apr. 13, 2017 issued in Application No. CN 201310021460.8.
Chinese Second Office Action dated Jan. 24, 2019 issued in Application No. CN 201610206201.6.
Chinese Second Office Action dated Mar. 15, 2021 issued in Application No. CN 201811075877.1.
Chinese Third Office Action dated Oct. 17, 2017 issued in Application No. CN 201310021460.8.
CN Office Action dated Mar. 7, 2022, in Application No. CN201711112653.9 with English translation.
CN Office Action dated Mar. 15, 2023 in Application No. CN201780070122.X with English Translation.
CN Office Action dated Mar. 30, 2023, in Application No. CN201880073124.9 with English translation.
CN Office Action dated Nov. 19, 2021, in application No. CN201711112653 with English translation.
CN Office Action dated Oct. 8, 2022 in Application No. CN201780070122.X with English Translation.
CN Office Action dated Sep. 16, 2022, in Application No. CN201780070305.1 with English translation.
CN Office Action dated Sep. 2, 2021, in application No. CN201811075877.1 with English translation.
European Examination Report dated Dec. 11, 2017 issued in Application No. EP 13 15 2046.
European Extended Search Report dated Apr. 14, 2014 issued in Application No. EP13152046.2.
Huang et al. (2017) "Design of efficient mono-aminosilane precursors for atomic layer deposition of SiO2 thin films," Royal Society of Chemistry Adv. 2017, 7:22672-22678.
International Preliminary Report on Patentability dated Dec. 15, 2022 from PCT/US2021/035269.
International Preliminary Report on Patentability dated Feb. 9, 2023 in PCT Application No. PCT/US2021/070988.
International Preliminary Report on Patentability dated Feb. 17, 2022 in PCT Application No. PCT/US2020/043459.
International Preliminary Report on Patentability dated Mar. 26, 2020 issued in Application No. PCT/US2018/050049.
International Preliminary Report on Patentability dated May 23, 2019 issued in Application No. PCT/US17/60692.
International Preliminary Report on Patentability dated May 23, 2019 issued in Application No. PCT/US2017/060240.
International Search Report and Written Opinion dated Apr. 14, 2023 in PCT Application No. PCT/US2022/080683.
International Search Report and Written Opinion dated Dec. 2, 2022 in PCT Application No. PCT/US2022/075296.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated Nov. 11, 2020 issued in Application No. PCT/US2020/043459.
International Search Report and Written Opinion dated Nov. 17, 2021, in PCT Application No. PCT/US2021/070988.
International Search Report and Written Opinion dated Sep. 23, 2021 in PCT Application No. PCT/US2021/035269.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.

(56) References Cited

OTHER PUBLICATIONS

Japanese Notice of Allowance Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
JP Office Action dated Oct. 18, 2022, in Application No. JP2020-514992 with English translation.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jul. 5, 2022 in Application No. KR10-2015-0163065 with English translation.
KR Office action dated Aug. 8, 2022 in KR Application No. KR10-2015-0162556 with English translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 12, 2022 in Application No. KR1020150163065 with English translation.
KR Office Action dated Jan. 26, 2022, in Application No. 10-2019-7016749 with English translation.
KR Office Action dated Jul. 12, 2022 in Application No. KR20197016749 With English translation.
KR Office Action dated Jul. 20, 2022, in Application No. KR10-2017-0147904 with English translation.
KR Office Action dated Jun. 7, 2022 in Application No. KR20210086044 with English translation.
KR Office Action dated Jun. 10, 2022, in Application No. KR1020170109223 with English translation.
KR Office Action dated Mar. 4, 2022, in Application No. KR10-2019-7017087 with English Translation.
KR Office Action dated Nov. 4, 2022 in Application No. KR10-2022-7018901 with English translation.
KR Office Action dated Nov. 30, 2021 in Application No. KR10-2019-7017087 with English Translation.
KR Office Action dated Oct. 6, 2022, in Application No. KR10-2015-0133942 with English Translation.
KR Office Action dated Sep. 6, 2022, in Application No. KR10-2017-0109223 with English translation.
KR Office Action dated Sep. 27, 2021, in application No. KR20210086044 with English translation.
KR Office Action dated Sep. 29, 2021, in application No. KR1020170109223 with English translation.
Kunnen, E. et al., "A way to integrate multiple block layers for middle of line contact patterning", in Advanced Etch Technology for Nanopatterning IV, Edited by Qinghuam Lin and Sebastian Engelmann, Mar. 17, 2015, Proc. of SPIE, vol. 9428, 94280W1-8, 8 pages. [Downloaded on Jun. 27, 2017 from http://proceedings.spiedigitallibrary.org ].
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP®80 Range," Oxford Instruments (2010), 8 pages.
Singapore Notice of Eligibility for Grant and Supplemental Examination Report dated Jan. 20, 2020 issued in Application No. SG 10201507848X.
Taiwan Examination Report dated Mar. 29, 2017 issued in Application No. TW 102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW 104138370.
Taiwanese First Office Action dated Mar. 25, 2020 issued in Application No. TW 105130541.
Taiwanese Notice of Allowance dated Feb. 17, 2019 issued in Application No. TW 104138370.
TW Office Action dated Jun. 17, 2022 in Application No. TW107131673 With English Translation.
U.S. Advisory Action dated May 20, 2019 issued in U.S. Appl. No. 15/349,746.
U.S. Appl. No. 16/852,261, inventors Abel et al., filed on Apr. 17, 2020.
U.S. Final Office Action dated Apr. 20, 2018 issued in U.S. Appl. No. 15/349,753.
U.S. Final Office Action dated Apr. 25, 2013 issued in U.S. Appl. No. 13/084,305.
U.S. Final Office Action dated Apr. 9, 2018 issued in U.S. Appl. No. 15/279,312.
U.S. Final Office Action dated Dec. 21, 2018 issued in U.S. Appl. No. 15/349,746.
U.S. Final Office Action dated Feb. 5, 2020 issued in U.S. Appl. No. 15/349,746.
U.S. Final Office Action dated Jan. 2, 2018 issued in U.S. Appl. No. 15/351,221.
U.S. Final Office Action dated Jan. 18, 2018 issued in U.S. Appl. No. 15/349,746.
U.S. Final Office Action dated Jan. 21, 2020 issued in U.S. Appl. No. 15/847,744.
U.S. Final Office Action dated Nov. 14, 2014 issued in U.S. Appl. No. 14/065,334.
U.S. Final Office Action dated Oct. 19, 2017 issued in U.S. Appl. No. 15/279,314.
U.S. Non-Final Office Action dated Jul. 5, 2017 issued in U.S. Appl. No. 15/351,221.
U.S. Notice of Allowance dated Apr. 25, 2018 issued in U.S. Appl. No. 15/253,546.
U.S. Notice of Allowance dated Aug. 18, 2015 issued in U.S. Appl. No. 14/494,914.
U.S. Notice of Allowance dated Dec. 11, 2019 issued in U.S. Appl. No. 15/279,312.
U.S. Notice of Allowance dated Dec. 5, 2018 issued in U.S. Appl. No. 15/703,917.

(56) References Cited

OTHER PUBLICATIONS

U.S. Notice of Allowance dated Feb. 1, 2016 issued in U.S. Appl. No. 14/552,245.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
U.S. Notice of Allowance dated Jan. 15, 2020 issued in U.S. Appl. No. 16/294,783.
U.S. Notice of Allowance dated Jul. 1, 2020 issued in U.S. Appl. No. 15/349,746.
U.S. Notice of Allowance dated Jul. 15, 2016 issued in U.S. Appl. No. 14/678,736.
U.S. Notice of Allowance dated Jul. 16, 2018 issued in U.S. Appl. No. 15/351,221.
U.S. Notice of Allowance dated Jul. 26, 2013, issued U.S. Appl. No. 13/414,619.
U.S. Notice of Allowance dated Jul. 26, 2018 issued in U.S. Appl. No. 15/829,702.
U.S. Notice of Allowance dated Jun. 17, 2019 issued in U.S. Appl. No. 15/349,753.
U.S. Notice of Allowance dated May 28, 2020 issued in U.S. Appl. No. 15/847,744.
U.S. Notice of Allowance dated Oct. 26, 2016 issued in U.S. Appl. No. 14/552,245.
U.S. Notice of Allowance dated Sep. 1, 2017 issued in U.S. Appl. No. 15/272,222.
U.S. Notice of Allowance dated Sep. 19, 2016 issued in U.S. Appl. No. 14/935,317.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Office Action dated Apr. 11, 2014 issued in U.S. Appl. No. 14/065,334.
U.S. Office Action dated Apr. 18, 2016 issued in U.S. Appl. No. 14/935,317.
U.S. Office Action dated Apr. 18, 2019 issued in U.S. Appl. No. 15/279,312.
U.S. Office Action dated Apr. 7, 2017 issued in U.S. Appl. No. 15/279,314.
U.S. Office Action dated Jul. 14, 2017 issued in U.S. Appl. No. 15/349,746.
U.S. Office Action dated Jul. 18, 2018 issued in U.S. Appl. No. 15/703,917.
U.S. Office Action dated Jul. 30, 2019 issued in U.S. Appl. No. 15/847,744.
U.S. Office Action dated Jun. 14, 2019 issued in U.S. Appl. No. 15/349,746.
U.S. Office Action dated Jun. 29, 2017 issued in U.S. Appl. No. 15/279,312.
U.S. Office Action dated Jun. 29, 2018 issued in U.S. Appl. No. 15/349,746.
U.S. Office Action dated Jun. 7, 2013 issued U.S. Appl. No. 13/414,619.
U.S. Office Action dated May 19, 2017 issued in U.S. Appl. No. 15/272,222.
U.S. Office Action dated May 24, 2016 issued in U.S. Appl. No. 14/552,245.
U.S. Office Action dated May 25, 2016 issued in U.S. Appl. No. 14/552,011.
U.S. Office Action dated Oct. 1, 2015 issued in U.S. Appl. No. 14/552,245.
U.S. Office Action dated Oct. 23, 2017 issued in U.S. Appl. No. 15/349,753.
U.S. Office Action dated Oct. 6, 2017 issued in U.S. Appl. No. 15/253,546.
U.S. Office Action dated Sep. 14, 2012 issued in U.S. Appl. No. 13/084,305.
U.S. Office Action dated Sep. 28, 2018 issued in U.S. Appl. No. 15/349,753.
U.S. Appl. No. 18/000,562, inventors Gupta et al., filed on Dec. 2, 2022.
U.S. Appl. No. 18/003,133, inventors Gupta et al., filed on Dec. 22, 2022.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
CN Office Action dated Jun. 29, 2023 in Application No. CN201780070122.X with English Translation.
CN Office Action dated Sep. 21, 2023, in Application No. CN201880073124.9 with English translation.
International Search Report and Written Opinion dated Apr. 28, 2023, in Application No. PCT/US2022/081972.
KR Office Action dated Aug. 17, 2023, in application No. KR10-2016-0039946 with English translation.
KR Office Action dated Jul. 14, 2023, in application No. KR10-2022-7018901 with English translation.
CN Office Action dated Dec. 6, 2023, in CN Application No. 202080055912.2, with English translation.
International Search Report and Written Opinion dated Oct. 28, 2022 in PCT Application No. PCT/US2022/036026.
International Preliminary Report on Patentability and Written Opinion dated Jan. 18, 2024 in PCT Application No. PCT/US2022/036026.
International Preliminary Report on Patentability and Written Opinion dated Mar. 7, 2024 in PCT Application No. PCT/US2022/075296.
International Search Report and Written Opinion dated Dec. 26, 2023 in PCT Application No. PCT/US2023/031873.
KR office action dated Apr. 24, 2022 in Application No. KR10-2015-0133942 with English Translation.
KR Office Action dated Aug. 30, 2023, in Application No. KR10-2020-7010492 with English Translation.
KR Office Action dated Feb. 5, 2024 in KR Application No. 10-2023-0184996, with English Translation.
KR Office Action dated Mar. 31, 2023, in Application No. KR10-2016-0122046 with English translation.
SG Written Opinion dated Jan. 17, 2024 in SG Application No. 11202201069Y.
U.S. Appl. No. 18/577,681, inventors Kumar; Ravi, et al., filed on Jan. 8, 2024.
U.S. Appl. No. 18/684,591, inventors Yang N, et al., filed on Feb. 16, 2024.
CN Office Action dated Sep. 11, 2024 in CN Application No. 202080055912.2 with English translation.
International Preliminary Report on Patentability and Written Opinion dated Jul. 4, 2024 in PCT Application No. PCT/US2022/081972.
International Preliminary Report on Patentability and Written Opinion dated Jul. 18, 2024 in PCT Application No. PCT/US2022/082624.
U.S. Appl. No. 18/727,030, inventors Gupta A, et al., filed on Jul. 5, 2024.

\* cited by examiner

THERMAL ATOMIC LAYER DEPOSITION OF SILICON-CONTAINING FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor device fabrication includes fabrication of microprocessors, logic, and memory devices. Semiconductor device fabrication may involve deposition of oxide and/or nitride films. As device and features size continue to shrink in the semiconductor industry, and also as 3-D device structures become more prevalent in integrated circuit (IC) design, the capability of depositing conformal films will continue to gain importance. Semiconductor device fabrication may involve deposition of nitride films. Atomic layer deposition (ALD) is a film forming technique which is well-suited to the deposition of conformal films. ALD processes may include thermal ALD and plasma-enhanced ALD.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

One aspect of the disclosure relates to a method of depositing a silicon oxide film. The method includes providing a substrate in a plasma processing chamber, depositing a first silicon oxide layer on a substrate via thermal atomic layer deposition (thermal ALD) in the plasma processing chamber, and depositing a second silicon oxide layer on the substrate via plasma-enhanced atomic layer deposition (PEALD) in the plasma processing chamber.

In some implementations, depositing the first silicon oxide layer by thermal ALD comprises heating the substrate to an elevated temperature, exposing the substrate to a silicon-containing precursor to adsorb onto a surface of the substrate, and posing the substrate to an oxygen-containing reactant while the substrate is heated to the elevated temperature to drive a reaction between the oxygen-containing reactant and the silicon-containing precursor to form the first silicon oxide layer. In some implementations, the elevated temperature is between about 500° C. and about 750° C. In some implementations, the oxygen-containing reactant includes oxygen ($O_2$), ozone ($O_3$), hydrogen peroxide ($H_2O_2$), water ($H_2O$), or combinations thereof. In some implementations, the silicon-containing precursor includes an aminosilane. In some implementations, a chamber pressure in the plasma processing chamber is equal to or greater than about 7 Torr. In some implementations, depositing the first silicon oxide layer by thermal ALD comprises heating the substrate to an elevated temperature, exposing the substrate to a silicon-containing precursor to adsorb onto a surface of the substrate, and flowing hydrogen ($H_2$) and oxygen ($O_2$) towards the substrate in the plasma processing chamber while the substrate is heated at the elevated temperature, where the hydrogen and oxygen react within the plasma processing chamber, where the first silicon oxide layer is formed on the substrate. In some implementations, depositing the second silicon oxide layer by PEALD comprises exposing the substrate to a second silicon-containing precursor to adsorb onto a surface of the substrate, and exposing the substrate to plasma generated from a second oxygen-containing reactant, where the plasma drives a reaction between reactive species of the second oxygen-containing reactant and the second silicon-containing precursor to form the second silicon oxide layer.

Another aspect of the disclosure relates to a method of depositing silicon oxide film. The method includes heating a substrate to an elevated temperature, exposing the substrate to a silicon-containing precursor to adsorb onto a surface of the substrate in a plasma processing chamber, and flowing hydrogen ($H_2$) and an oxygen-containing reactant towards the substrate in the plasma processing chamber, where the hydrogen and the oxygen-containing reactant react within the plasma processing chamber, where a layer of a silicon oxide film is formed on the substrate.

In some implementations, the hydrogen and the oxygen-containing reactant react in situ with one another within the plasma processing chamber in an exothermic reaction and drive formation of the layer of the silicon oxide film. In some implementations, the elevated temperature is between about 500° C. and about 650° C. In some implementations, a chamber pressure of the plasma processing chamber is equal to or greater than about 7 Torr. In some implementations, the oxygen-containing reactant includes oxygen ($O_2$) or ozone ($O_3$). In some implementations, the method further includes applying plasma power to the plasma processing chamber to ignite plasma generated from the hydrogen and oxygen-containing reactant in the plasma processing chamber. In some implementations, flowing the hydrogen and the oxygen-containing reactant comprises flowing the oxygen-containing reactant continuously into the plasma processing chamber, and pulsing the hydrogen at regular intervals into the plasma processing chamber. In some implementations, (i) exposing the substrate to the silicon-containing precursor and (ii) flowing the hydrogen and oxygen-containing reactant are performed cyclically in a thermal atomic layer deposition (thermal ALD) process. In some implementations, (i) exposing the substrate to the silicon-containing precursor and (ii) flowing the hydrogen and oxygen-containing reactant are performed continuously in a thermal chemical vapor deposition (thermal CVD) process. In some implementations, the method further includes depositing one or more additional layers the silicon oxide film on the substrate via PEALD in the plasma processing chamber.

Another aspect of the disclosure relates to a plasma apparatus for depositing a silicon oxide film. The plasma apparatus includes a plasma processing chamber, a substrate support in the plasma processing chamber for supporting a substrate, where the substrate support is configured to be heated to an elevated temperature, a showerhead fluidly coupled to the plasma processing chamber for delivery of precursors and reactants into the plasma processing chamber, an RF power supply configured to power plasma in the plasma processing chamber, and a controller. The controller is configured with instructions for performing the following operations: heat the substrate to an elevated temperature, expose the substrate to a silicon-containing precursor to adsorb onto a surface of the substrate in the plasma processing chamber, and flow hydrogen ($H_2$) and an oxygen-containing reactant towards the substrate in the plasma processing chamber, where the hydrogen and oxygen-containing reactant react within the plasma processing chamber, where a layer of a silicon oxide film is formed on the substrate.

In some implementations, the controller is further configured with instructions for performing the following operation: apply plasma power to the plasma processing chamber to ignite plasma generated from the hydrogen and oxygen-containing reactant in the plasma processing chamber. In some implementations, the controller is further configured with instructions for performing the following operations: deposit one or more additional layers of the silicon oxide film on the substrate via PEALD in the plasma processing chamber.

These and other aspects are described below with reference to the drawings.

DETAILED DESCRIPTION

Figure 1:
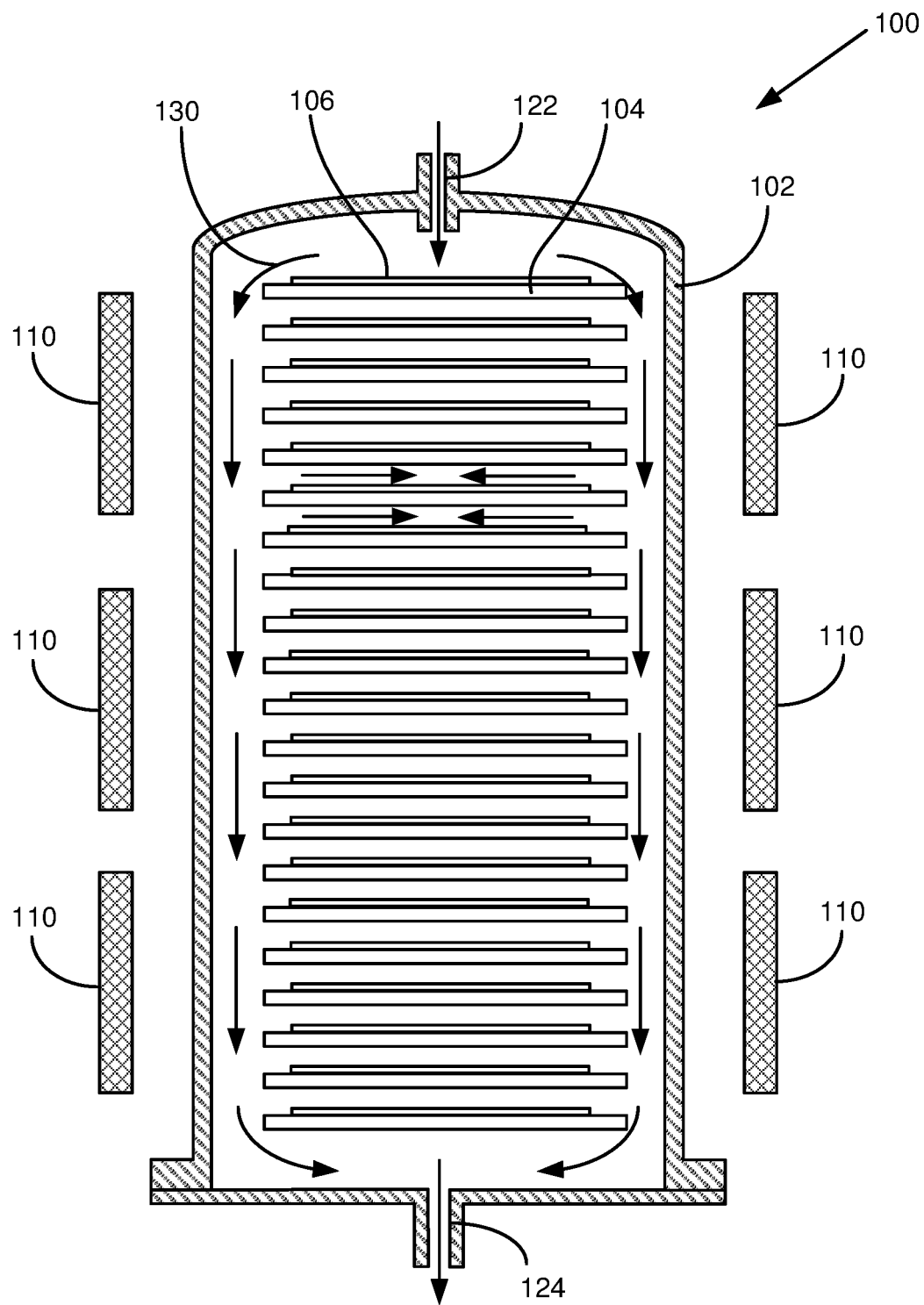
FIG. 1 shows a schematic diagram of an example thermal atomic layer deposition (thermal ALD) furnace reactor for depositing various films.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Silicon-containing films have various physical, chemical, and mechanical properties and are often used in semiconductor fabrication processes. For example, silicon nitride, silicon oxide, or silicon oxynitride films may be used as diffusion barriers, gate insulators, sidewall spacers, etch stop layers, dielectric films, and encapsulation layers. For example, silicon oxide films may be used as a low-k dielectric film in a semiconductor device. In various applications, silicon-containing films are deposited by chemical vapor deposition (CVD) or atomic layer deposition (ALD). In various implementations, the silicon-containing films are deposited conformally onto features of a substrate.

ALD is a technique that deposits thin layers of material using sequential self-limiting reactions. Typically, an ALD cycle includes operations to deliver and adsorb at least one precursor to the substrate surface, and then react the adsorbed precursor with one or more reactants to form the partial layer of film. Purge steps are ordinarily carried out between delivery of the precursor and delivery of the one or more reactants.

Thermal ALD uses heat to cause a reaction between the adsorbed precursor and the one or more reactants. While thermal ALD may work well to deposit certain types of materials, thermal ALD often has a slow deposition rate due to long reaction completion times. Thermal ALD is often performed at very high temperatures, but many chemical precursors or reactants may decompose (e.g., pyrolysis) at such elevated temperatures.

PEALD uses plasma to promote reaction between the adsorbed precursor and reactant radicals within the plasma. Reactant plasma is pulsed into a deposition chamber to react with the adsorbed precursor and form deposited material. PEALD may have a higher deposition rate and may operate at lower temperatures than thermal ALD. While PEALD processes may overcome some of the shortcomings of thermal ALD, PEALD processes may have some limitations. For example, PEALD may cause plasma damage to a substrate (e.g., etching, oxidations), and such plasma damage may occur on sensitive substrate materials such as silicon, germanium, silicon-germanium, carbon, and metals like molybdenum, tungsten, copper, cobalt, ruthenium, rhodium, and iridium. Additionally, PEALD may be incompatible with certain chemical precursors.

Conventional methods for depositing films by thermal ALD are accomplished using furnace reactors or batch reactors. Some furnace reactors can be hot wall systems, which have the advantage of more uniform temperature distributions and reduced convection effects.

FIG. 1 shows a schematic diagram of an example thermal atomic layer deposition furnace reactor for depositing various films. It will be understood that the thermal ALD furnace reactor 100 can also be substituted as a thermal CVD reactor. The thermal ALD furnace reactor 100 can include a plurality of heaters 110 surrounding a wall 102 of the thermal ALD furnace reactor 100. The plurality of heaters 110 can provide multiple heating zones that allow for some control of the axial temperature along the thermal ALD furnace reactor 100. In some implementations, the temperature range of the thermal ALD furnace reactor 100 is controlled to be between about 650° C. and about 1150° C. The implementation of the thermal ALD furnace reactor 100 in FIG. 1 is a hot wall system.

The thermal ALD furnace reactor 100 can include a plurality of wafers 106 stacked over one another. Each of the wafers 106 may be supported by a wafer support 104 and held by gravity. The wafer-to-wafer spacing along the vertical direction of the thermal ALD furnace reactor 100 can be uniform. This allows for tens or hundreds of wafers 106 to be batch processed in a single run through the thermal ALD furnace reactor 100. The thermal ALD furnace reactor 100 is shown holding wafers 106 in a vertically-separated manner, though it will be understood that the thermal ALD furnace reactor 100 can hold wafers 106 in a horizontally-separated manner.

Reactant gases 130 enter the thermal ALD furnace reactor 100 by flowing through a gas inlet 122. The reactant gases 130 can include precursors for adsorption followed by reactant species to react with the adsorbed precursors. The timing and rate of flow of the reactant gases 130 can be controlled by, e.g., valves and mass flow controllers, as known in the art. The reactant gases 130 circulate through the thermal ALD furnace reactor 100 by convection and flow towards the wafers 106 by diffusion. To deposit thin films on each of the wafers 106, the thermal ALD furnace reactor 100 can be reduced to a low pressure and heated to a desirable deposition temperature, such as a temperature greater than about 700° C., or between about 700° C. and about 850° C., or between about 700° C. and about 800° C. The high temperature drives a chemical reaction between the reactant gases 130 to form thin films on each of the wafers 106, where the reactant gases 130 may be delivered sequentially in pulses. The reactant gases 130 are delivered through the gas inlet 122 and diffuse towards each of the wafers 106. Excess reactant gases 130 may exit the thermal ALD furnace reactor 100 via gas outlet 124. The deposition temperature must remain high to achieve a sufficient deposition rate for sufficient throughput.

Various oxides and nitrides, such as silicon oxide, silicon nitride, aluminum nitride, aluminum oxide, and titanium oxide, may be deposited using a thermal ALD reactor like the thermal ALD furnace reactor 100 of FIG. 1. However, the deposition of such oxides and nitrides in the thermal ALD reactor may require a high thermal budget. For example, processing temperatures may be greater than 700° C. for thermal ALD. In addition, the thermal ALD reactor may suffer from chemical depletion effects, resulting in thickness variations across each wafer surface and through the thermal ALD reactor from the top of the reactor to the bottom of the reactor. Moreover, subsequent wafer processing in plasma reactors may require transfers between different tools and platforms, increasing processing time, processing steps, cost, and the likelihood of unwanted materials or particles coming into contact with the wafers.

Figure 2:
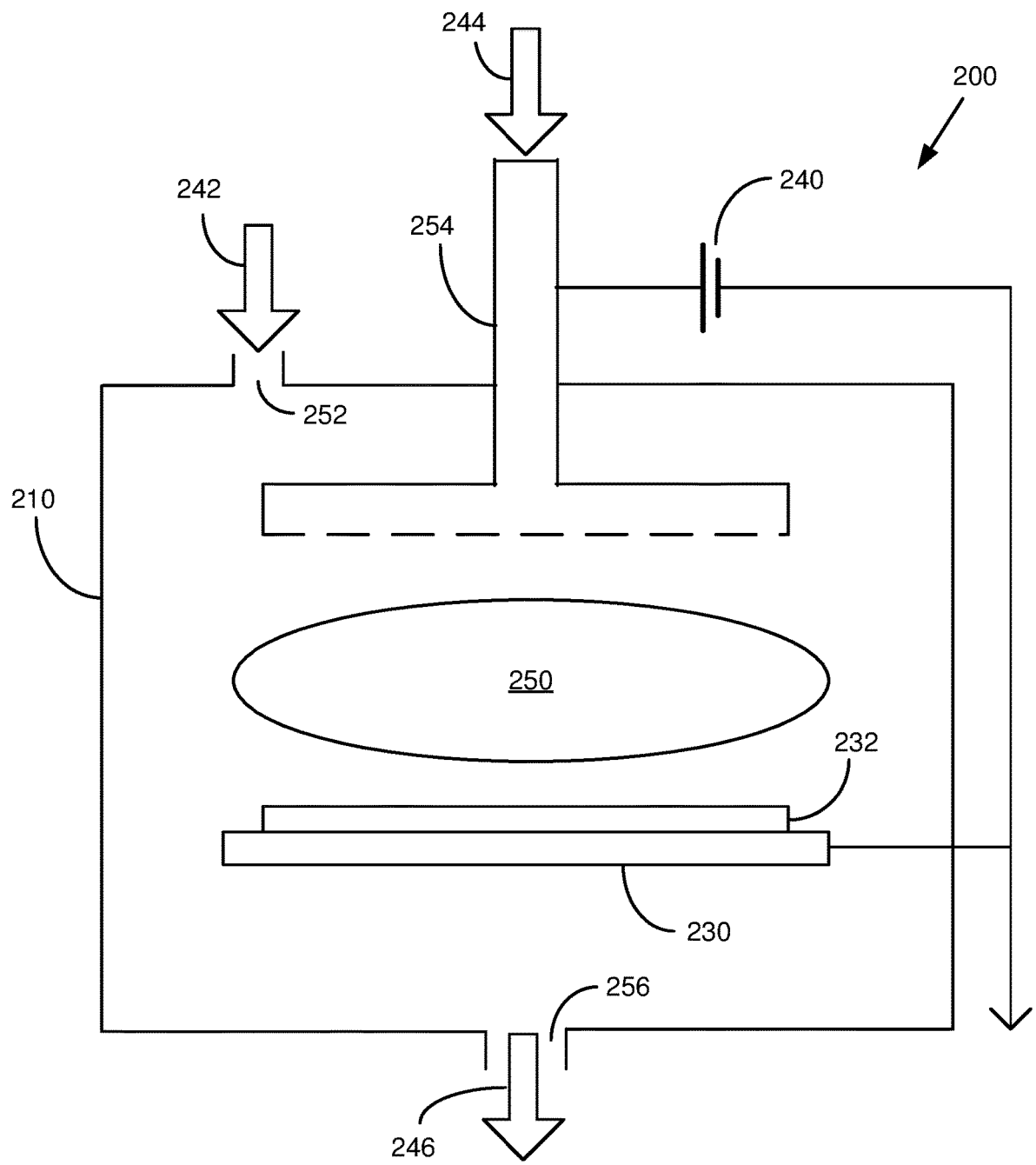
FIG. 2 shows a schematic diagram of an example plasma reactor configured to perform plasma-enhanced atomic layer deposition (PEALD) for depositing various films.

FIG. 2 shows a schematic diagram of an example plasma reactor configured to perform plasma-enhanced atomic layer deposition for depositing various films. The plasma reactor 200 includes a plasma processing chamber 210 having a substrate support 230 configured to support a substrate 232. A first gas 242 may be delivered into the plasma processing chamber 210 through a first gas inlet 252 coupled to the plasma processing chamber 210, where the first gas 242 may include precursors for adsorbing onto a surface of the substrate 232. A second gas 244 may be delivered into the plasma processing chamber 210 through a second gas inlet or showerhead 254 coupled to the plasma processing chamber 210, where the second gas 244 may include gas reactants for plasma generation. It will be understood that in some implementations the first gas 242 may be delivered into the plasma processing chamber 210 through the showerhead 254. Unreacted gas or byproducts 246 may exit the plasma processing chamber 210 through a gas outlet or pump 256.

The plasma reactor 200 includes a power source 240 coupled to the plasma processing chamber 210 and configured to generate plasma 250 in the plasma processing chamber 210. For example, the power source 240 may be coupled to either the showerhead 254 or the substrate support 230. An RF voltage may be applied to an electrode of the showerhead 254, where the plasma 250 may be generated between two electrodes spaced apart. The plasma 250 may be generated at relatively low pressure. The use of the plasma 250 reduces the temperature for growth/formation of films on the substrate 232 due to the high reactivity of radicals in the plasma 250.

Various oxides and nitrides, such as silicon oxide, silicon nitride, aluminum nitride, aluminum oxide, and titanium oxide, may be deposited using a plasma reactor like the plasma reactor 200 of FIG. 2. Low deposition temperature and high reactivity of radicals in PEALD processes may result in many chemical reaction schemes that are difficult or impossible with thermal ALD processes. However, PEALD processes may cause substrate damage such as plasma damage or plasma oxidation on sensitive substrates.

Thermal ALD in Plasma Processing Chamber

The present disclosure relates to deposition of oxide and/or nitride films on a substrate using thermal ALD in a single wafer plasma reactor. The oxide and/or nitride films may be silicon-containing films, where the silicon-containing films may be silicon oxide ($SiO_x$), silicon nitride ($Si_xN_y$), or silicon oxynitride ($SiO_xN_y$). While such silicon-containing films may ordinarily be deposited by PEALD processes, such silicon-containing films may be deposited by thermal ALD within the same plasma reactor used for PEALD processes. In some implementations, the thermal ALD performed within the same plasma reactor as the PEALD processes may drive thermal oxidation/nitridation at an elevated temperature that is less than the high temperatures used in conventional thermal ALD furnace reactors. For example, the elevated temperature may be between about 500° C. and about 750° C. or between about 500° C. and about 650° C. Thermal ALD performed within the same plasma reactor as PEALD processes may enable deposition of silicon-containing films with high conformality, high deposition rate, limited surface oxidation, limited bending of substrate features (e.g., pillars, fins), and uniform wet etch rate along the depth of the structure, among other advantages. In other words, highly conformal films may be deposited by thermal ALD in a plasma processing chamber with little to no damage/oxidation to the substrate.

In some implementations of the present disclosure, thermal ALD of silicon-containing films in a plasma processing chamber may be achieved using a silicon-containing precursor and multiple gas reactants that react with one another in situ. For example, thermal ALD of a silicon oxide film in a plasma processing chamber may be achieved using a silicon-containing precursor and hydrogen ($H_2$) and oxygen ($O_2$) that react in situ over a substrate to cause an exothermic reaction. The exothermic reaction may provide energy to drive oxide formation for improved deposition rate. In some implementations of the present disclosure, low RF power may be applied to the plasma processing chamber to ignite plasma while flowing hydrogen and oxygen during thermal ALD. In some implementations of the present disclosure, silicon-containing films may be deposited in a plasma processing chamber using thermal CVD instead of thermal ALD. In some implementations of the present disclosure, silicon-containing films may be deposited in a plasma processing chamber using thermal ALD followed by PEALD. In some implementations of the present disclosure, silicon-containing films may be deposited in a plasma processing chamber using PEALD followed by thermal ALD.

Deposition of silicon-containing films by thermal ALD in a plasma processing chamber reduces damage that may otherwise be caused by deposition of silicon-containing films by PEALD. This can be due in part to the low presence of radicals and ionic species in thermal ALD. Moreover, thermal ALD in the plasma processing chamber of the present disclosure reduces damage on substrates that may otherwise be caused by deposition of silicon-containing films using conventional thermal ALD reactors operating at high thermal budgets. The silicon-containing films deposited by thermal ALD in the plasma processing chamber of the present disclosure may be deposited at a comparable deposition rate as PEALD and may provide as high quality film as films deposited by PEALD.

Though the present disclosure is largely described with reference to thermal ALD in the present disclosure, it will be understood that "thermal ALD" in the present disclosure can refer to reaction mechanisms for thermal ALD reactions occurring cyclically and reaction mechanisms for thermal CVD reactions occurring continuously. In addition, it will be understood that though the present disclosure is largely described with reference to deposition of silicon oxide films, the present disclosure can encompass deposition of any oxide or nitride films using thermal ALD.

Figure 3A:
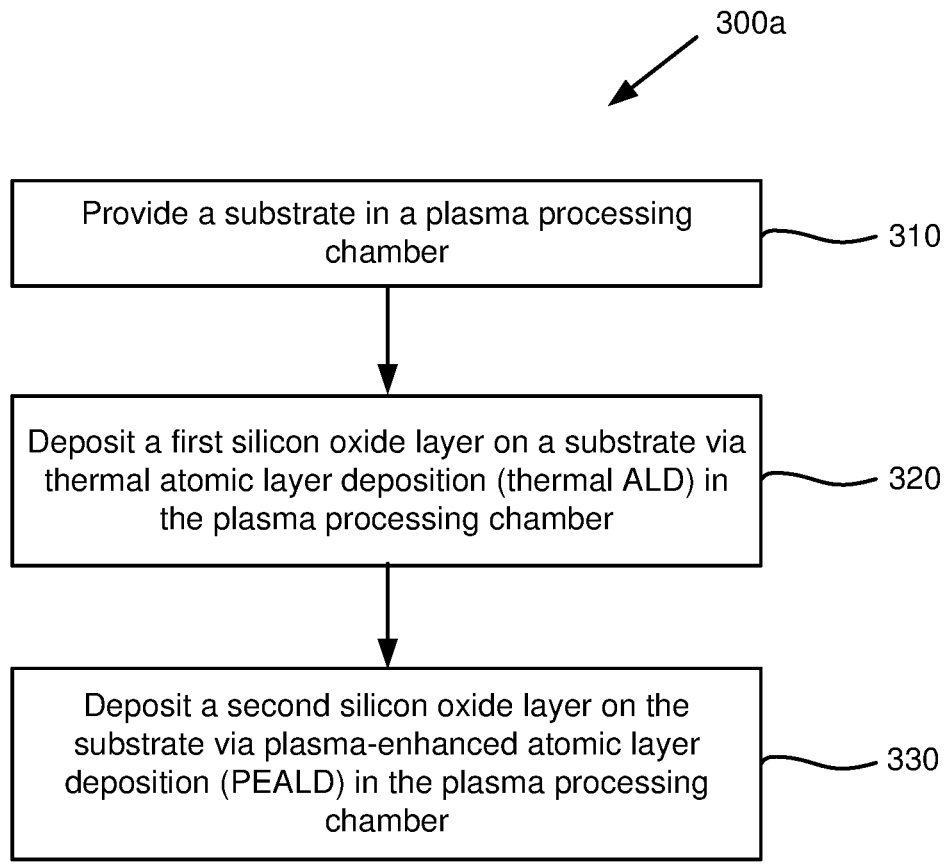
FIG. 3A shows a flow diagram of an example process for depositing a silicon oxide film using thermal ALD and PEALD according to some implementations.
Figure 4:
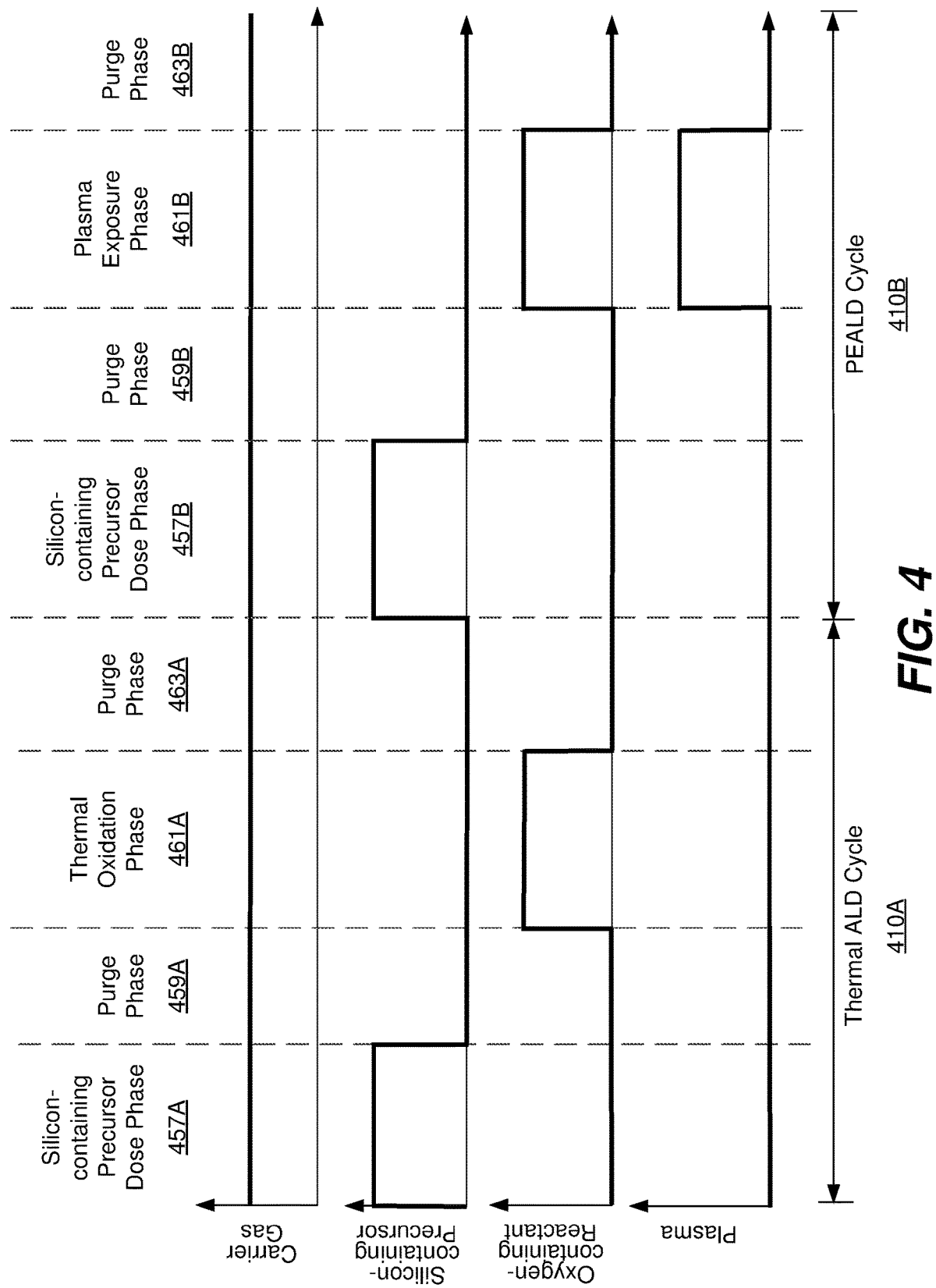
FIG. 4 illustrates an example timing sequence diagram showing a thermal ALD cycle and a PEALD cycle for depositing a silicon oxide film according to some implementations.

FIG. 3A shows a flow diagram of an example process for depositing a silicon oxide film using thermal ALD and PEALD according to some implementations. As used herein, the term "silicon oxide film" may refer to undoped silicon oxide (e.g., $SiO_x$) films as well as doped silicon oxide (e.g., $SiO_xN_y$) films. The operations in a process 300a of FIG. 3A may be performed in different orders and/or with different, fewer, or additional operations. The operations in the process 300a may be performed by a plasma processing apparatus shown in FIG. 11 and/or the process tool shown in FIG. 12. In some implementations, the operations of the process 300a may be implemented, at least in part, according to software stored in one or more non-transitory computer readable media. FIGS. 3A and 4 may be described together below.

At block 310 of the process 300a, a substrate is provided in a plasma processing chamber. The plasma processing chamber may be a single wafer plasma reactor configured to perform thermal ALD processes, PEALD processes, or combinations thereof. The substrate may be a silicon substrate, such as a 200-mm, 300-mm, or 450-mm substrate, including substrates having one or more layers of material, such as dielectric, conducting, or semiconducting material.

In some implementations, the substrate on which silicon oxide films are deposited may include a material that is sensitive to plasma damage/oxidation by PEALD. For example, the material may include but is not limited to silicon (Si), germanium (Ge), silicon-germanium (Si—Ge), carbon (C), and metals, where example metals include molybdenum (Mo), tungsten (W), copper (Cu), cobalt (Co), ruthenium (Ru), rhodium (Rh), and iridium (Ir). The substrate on which the silicon oxide films are deposited may include one or more features, which may refer to non-planar structures of a substrate. For example, the one or more features may include vertical structures such as fins or pillars. In some implementations, the one or more features may include an under-layer such as a barrier layer, liner layer, or adhesion layer.

At block 320 of the process 300a, a first silicon oxide layer is deposited via thermal ALD in the plasma processing chamber. Any suitable number of thermal ALD cycles may be performed at block 320 prior to performing PEALD. Each thermal ALD cycle may be broken down into a series of phases, including a dose phase, a first purge phase, a thermal oxidation phase, and a second purge phase. It will be understood that one or both of the first purge phase and the second purge phase may be optionally performed in each thermal ALD cycle. Depositing a thin film via thermal ALD includes: heating the substrate to an elevated temperature, exposing the substrate to a precursor to adsorb onto a surface of the substrate, and exposing the substrate to one or more gas reactants to drive a surface reaction between the one or more gas reactants and the precursor, thereby forming the thin film via thermal ALD. Specifically, depositing the first silicon oxide layer via thermal ALD includes: heating the substrate to an elevated temperature, exposing the substrate to a silicon-containing precursor to adsorb onto a surface of the substrate, and exposing the substrate to an oxygen-containing reactant to drive a reaction between the oxygen-containing reactant and the silicon-containing precursor, thereby forming the first silicon oxide layer via thermal ALD.

FIG. 4 illustrates an example timing sequence diagram showing a thermal ALD cycle and a PEALD cycle for depositing a silicon oxide film according to some implementations. FIG. 4 shows phases in a thermal ALD cycle 410A followed by phases in a PEALD cycle 410B. However, it will be understood that phases in the PEALD cycle 410B may be followed by phases in the thermal ALD cycle 410A. FIG. 4 shows various process parameters, such as carrier gas or purge gas flow, plasma, silicon-containing precursor flow, and oxygen-containing reactant flow. The lines indicate when the flow is turned on/off, or when plasma is turned on/off. As shown in FIG. 4, during the thermal ALD cycle 410A, the substrate is exposed to a silicon-containing precursor during a dose phase 457A. In some implementations, the silicon-containing precursor includes a silane, such as an aminosilane. An aminosilane includes at least one nitrogen atom bonded to a silicon atom, but may also contain hydrogens, oxygens, halogens and carbons. Examples of aminosilanes may include bis(tert-butylamino)silane (BTBAS), N-(diethylaminosilyl)-N-ethylethanamine (SAM-24), tris(dimethylamino)silane (3DMAS), and tetrakis(dimethylamino)silane (4DMAS). During the dose phase 457A, plasma is turned off, oxygen-containing reactant flow is turned off, and a carrier gas may be flowed towards the substrate. However, it will be understood that the substrate may be heated to an elevated temperature during the dose phase 457A. In some implementations, the substrate may be exposed to the silicon-containing precursor during the dose phase 457A for a duration between about 0.1 seconds and about 60 seconds, between about 0.2 seconds and about 6 seconds, or between about 0.3 seconds and about 2 seconds, such as about 0.75 seconds, depending on the flow rate and substrate surface area. In some implementations, the silicon-containing precursor adsorbs onto the surface of the substrate in a self-limiting manner such that once active sites are occupied by the silicon-containing precursor, little or no additional silicon-containing precursor will be adsorbed on the surface of the substrate. When the silicon-containing precursor adsorbs onto active sites of the surface of the substrate, a thin layer of the silicon-containing precursor forms on the surface. Unlike a CVD or CVD-like process, the silicon-containing precursor does not decompose to form a silicon layer.

In some implementations, the plasma processing chamber may be purged between operations of exposing the substrate to the silicon-containing precursor and exposing the substrate to the oxygen-containing reactant. In addition, the plasma processing chamber may be purged after exposing the substrate to the oxygen-containing reactant. Purging may involve a sweep gas, which may be a carrier gas used in other operations/phases or a different gas. Purging may remove excess species in the vapor phase that did not adsorb or react on the surface of the substrate. As shown in FIG. 4, the plasma processing chamber undergoes purging during purge phases 459A and 463A. Silicon-containing precursor flow is turned off, plasma is turned off, and oxygen-containing reactant flow is turned off. However, the carrier gas may continue to flow towards the substrate. In some implementations, the purge phases 459A and 463A may each include one or more evacuation sub-phases for evacuating the plasma processing chamber. Alternatively, it will be appreciated that each of the purge phases 459A and 463A may be omitted in some implementations. Each purge phase 459A and 463A may have a suitable duration, such as between about 0 seconds and about 60 seconds or between about 0.01 seconds and about 6 seconds.

As shown in FIG. 4, during the thermal ALD cycle 410A, the substrate may be exposed to the oxygen-containing reactant and the elevated temperature during a thermal oxidation phase 461A. Process conditions during the thermal oxidation phase 461A may be tuned to promote deposition of the first silicon oxide layer by thermal ALD at an appreciable or adequate deposition rate. For example, the deposition rate of the first silicon oxide layer by thermal ALD can be equal to or greater than about 0.2 Å/cycle, equal to or greater than about 0.3 Å/cycle, equal to or greater than about 0.5 Å/cycle, or equal to or greater than about 0.75 Å/cycle. This may be an appreciable deposition rate when the first silicon oxide layer is used to protect a surface against oxidation/damage.

In some implementations, the oxygen-containing reactant can include an oxidant gas such as oxygen ($O_2$), ozone ($O_3$), hydrogen peroxide ($H_2O_2$), water ($H_2O$), or combinations thereof. In some implementations, exposing the substrate to the oxygen-containing reactant includes flowing hydrogen and oxygen to the substrate to react in situ within the plasma processing chamber to cause an exothermic reaction. In some implementations, it is believed that water may be formed in situ by a reaction between the hydrogen and oxygen. Water vapor is not flowed into the plasma processing chamber as a starting reactant, but may or may not be formed in situ within the plasma processing chamber. As used herein, flowing "hydrogen" refers to flowing molecular hydrogen and flowing "oxygen" refers to flowing molecular oxygen. The hydrogen and oxygen may be flowed towards the substrate in the plasma processing chamber simultaneously. The exothermic reaction involving hydrogen and oxygen may release energy for driving a surface reaction with the adsorbed silicon-containing precursor to form the first silicon oxide layer. A flow rate of hydrogen during the thermal oxidation phase 461A may be between about 0 slm and about 20 slm, between about 1 slm and about 10 slm, between about 2 slm and about 6 slm, greater than about 3 slm, such as about 4 slm. A flow rate of oxygen during the thermal oxidation phase 461A may be between about 0.5 slm and about 20 slm, between about 1 slm and about 10 slm, or between about 2 slm and about 8 slm, such as about 5 slm. A flow rate ratio between hydrogen and oxygen may be equal to or less than about 1.2:1, such as between about 0.5:1 and about 1.2:1.

The substrate may be exposed to the oxygen-containing reactant and exposed to an elevated temperature for a suitable duration during the thermal oxidation phase 461A. Ordinarily, thermal oxidation in furnace or batch reactors in thermal ALD/CVD chambers may last at least 10 seconds to obtain an appreciable deposition rate, particularly for silicon oxide films. However, the duration of thermal oxidation in the plasma processing chamber of the present disclosure may be less than about 10 seconds. In some implementations, the duration of thermal oxidation in the thermal oxidation phase 361A may be between about 0.1 seconds and about 6 seconds, between about 0.2 seconds and about 4 seconds, or between about 0.5 seconds and about 3 seconds.

The substrate may be exposed to an elevated temperature during the thermal oxidation phase 461A and/or prior to the thermal oxidation phase 461A. The substrate may be operating at the elevated temperature simultaneously with exposing the substrate to the oxygen-containing reactant. In some implementations, the elevated temperature may be between about 500° C. and about 750° C., between about 500° C. and about 700° C., between about 500° C. and about 650° C., or between about 550° C. and about 650° C. Ordinarily, temperatures in furnace or batch reactors in thermal ALD/CVD chambers may be greater than 700° C. in driving surface reactions for deposition of silicon oxide films. However, temperatures may be equal to or less than about 700° C. in driving surface reactions for deposition of silicon oxide films by thermal ALD in a plasma processing chamber of the present disclosure. Furthermore, many conventional plasma processing chambers for PEALD do not operate at temperatures equal to or greater than about 400° C. Deposition by thermal ALD in the plasma processing chamber at the elevated temperature may be equal to or greater than about 0.2 Å/cycle.

The substrate may be exposed to increased chamber pressure during the thermal oxidation phase 461A. Increased chamber pressure may increase deposition rate and drive the surface reaction between the silicon-containing precursor and the oxygen-containing reactant. In some implementations, the chamber pressure of the plasma processing chamber may be equal to or greater than about 7 Torr, equal to or greater than about 10 Torr, equal to or greater than about 12 Torr, or between about 10 Torr and about 20 Torr. Ordinarily, a pressure in a furnace or batch reactor in thermal ALD/CVD chambers may be less than about 5 Torr. However, chamber pressure may be equal to or greater than about 5 Torr for deposition by thermal ALD in the plasma processing chamber of the present disclosure. In addition, some conventional plasma processing chambers for PEALD do not typically operate at pressures equal to or greater than 5 Torr.

The process conditions to achieve an appreciable deposition rate may be different during the thermal oxidation phase 461A depending on the selected gas reactants. In some implementations, where the gas reactant consists of oxygen, a deposition rate greater than about 0.2 Å/cycle may be achieved at temperatures between about 550° C. and about 700° C. and chamber pressures equal to or greater than about 12 Torr. Such implementations may be referred to as an oxygen-only flow. In some implementations, where the gas reactants consist of hydrogen and oxygen, a deposition rate equal to or greater than about 0.7 Å/cycle may be achieved at temperatures between about 500° C. and about 700° C. and chamber pressures equal to or greater than about 7 Torr. Such implementations may be referred to as a co-flow of hydrogen and oxygen ($H_2/O_2$). The co-flow of hydrogen and oxygen may enable higher deposition rates even at lower temperatures and pressures in the plasma processing chamber. Specifically, thermal oxidation may occur at a faster rate using the co-flow of hydrogen and oxygen compared to an oxygen-only flow.

A plurality of thermal ALD cycles 410A may be performed to form the first silicon oxide layer on the substrate. In some implementations, the first silicon oxide layer deposited by thermal ALD may serve as a liner layer prior to deposition by PEALD. The liner layer may protect underlying layers from substrate damage and/or provide a high quality liner in high aspect ratio structures. In some implementations, the first silicon oxide layer may be relatively thin and be between about 1 Å and about 100 Å, such as between about 10 Å and about 100 Å. For such thicknesses involving an oxygen-only flow, the number of thermal ALD cycles may be between about between about 5 cycles and about 50 cycles, between about 5 cycles and about 20 cycles, or between about 5 cycles and about 10 cycles.

Figure 13:
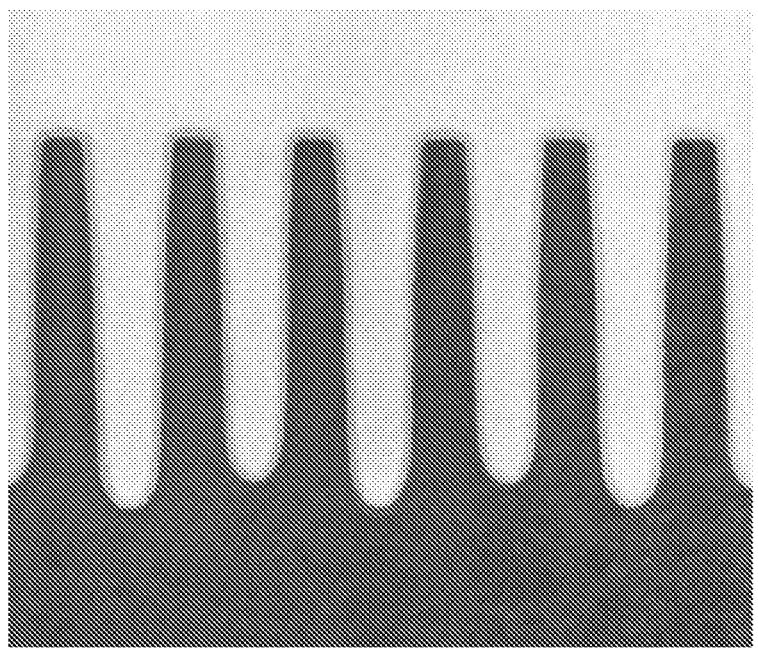
FIG. 13 shows an image of silicon oxide film deposited on fin structures by thermal ALD using several ALD cycles.

The first silicon oxide layer deposited by the plurality of thermal ALD cycles 410A may cause little to no damage to the substrate and little to no oxidation to the substrate. For example, an amount of silicon substrate oxidation may be between about 1 Å and about 3 Å when using oxygen-only flow of thermal ALD process, whereas a typical PEALD process results in silicon substrate oxidation between about 15 Å and about 35 Å. Where the first silicon oxide layer is deposited on vertical structures of the substrate, little to no bending occur on the vertical structures. The wet etch rate of the first silicon oxide layer along the depth of the vertical structures is uniform. Furthermore, where the substrate includes one or more features, a step coverage of the first silicon oxide layer is highly conformal. For example, the step coverage of the first silicon oxide layer may be equal to or greater than about 85%, equal to or greater than about 90%, or equal to or greater than about 95%. FIG. 13 shows an image of silicon oxide film deposited on fin structures at 650° C. using thermal ALD, where the deposited silicon oxide film exhibits high conformality and limited bending of the fin structures.

At block 330 of the process 300, a second silicon oxide layer is deposited on the substrate via PEALD in the plasma processing chamber. The thermal ALD operation at block 320 and the PEALD operation at block 330 are performed in the same plasma processing chamber. Any suitable number of PEALD cycles may be performed at block 330 after performing thermal ALD. Each PEALD cycle may be broken down into a series of phases, including a dose phase, a first purge phase, a plasma exposure phase, and a second purge phase. It will be understood that one or both of the first purge phase and the second purge phase may be optionally performed in each PEALD cycle. Depositing a thin film via PEALD includes: exposing the substrate to a precursor to adsorb onto a surface of the substrate, and exposing the substrate to plasma generated from one or more gas reactants, where the plasma drives a reaction between reactive species of the one or more gas reactants and the precursor, thereby forming the thin film via PEALD. Specifically, depositing the second silicon oxide layer by PEALD includes: exposing the substrate to a silicon-containing precursor to adsorb onto the surface of the substrate, and exposing the substrate to plasma generated from an oxygen-containing reactant, where the plasma drives a reaction between reactive species of the oxygen-containing reactant and the silicon-containing precursor, thereby forming the second silicon oxide layer via PEALD. The silicon-containing precursor in the PEALD cycles may or may not be the same as the silicon-containing precursor in the thermal ALD cycles. In addition, the oxygen-containing reactant in the PEALD cycles may or may not be the same as the oxygen-containing reactant in the thermal ALD cycles. For example, the oxygen-containing reactant may include oxygen, ozone, or combinations thereof.

As shown in FIG. 4, during the PEALD cycle 410B, the substrate is exposed to a silicon-containing precursor during a dose phase 457B. In some implementations, the silicon-containing precursor includes a silane, such as an aminosilane. During the dose phase 457B, plasma is turned off, oxygen-containing reactant flow is turned off, and a carrier gas may be flowed towards the substrate. In some implementations, the silicon-containing precursor adsorbs onto the surface of the substrate in a self-limiting manner such that once active sites are occupied by the silicon-containing precursor, little or no additional silicon-containing precursor will be adsorbed on the surface of the substrate.

In some implementations, the plasma processing chamber may be purged between operations of exposing the substrate to the silicon-containing precursor and exposing the substrate to an oxygen-containing reactant. In addition, the plasma processing chamber may be purged after exposing the substrate to the oxygen-containing reactant. Purging may involve a sweep gas, which may be a carrier gas used in other operations/phases or a different gas. Purging may remove excess species in the vapor phase that did not adsorb or react onto the surface of the substrate. As shown in FIG. 4, the plasma processing chamber undergoes purging during purge phases 459B and 463B. Silicon-containing precursor flow is turned off, plasma is turned off, and oxygen-containing reactant flow is turned off. However, the carrier gas may continue to flow towards the substrate. In some implementations, the purge phases 459B and 463B may each include one or more evacuation sub-phases for evacuating the plasma processing chamber. Alternatively, it will be appreciated that each of the purge phases 459B and 463B may be omitted in some implementations.

As shown in FIG. 4, during the PEALD cycle 410B, the substrate may be exposed to the plasma generated from the oxygen-containing reactant during a plasma exposure phase 461B. An oxygen plasma may be ignited during the plasma exposure phase 461B. The plasma may include ions, radicals, charged neutrals, and other reactive species generated from the oxygen-containing reactant. The reactive species from the oxygen-containing reactant may react with the adsorbed silicon-containing precursor to form the second silicon oxide layer over the first silicon oxide layer. The plasma may be generated in situ or remotely. Flow of the silicon-containing precursor is turned off while flow of the oxygen-containing reactant is turned on during the plasma exposure phase 461B.

Process conditions in the plasma processing chamber may vary for the oxygen plasma during the plasma exposure phase 461B. In some implementations, the substrate temperature may be maintained between about 0° C. and about 750° C. or between about 20° and about 200° C. In some implementations, the chamber pressure in the plasma processing chamber may be relatively low and between about 10 mTorr and about 200 mTorr, or may be relatively high and between about 1 Torr and about 7 Torr. An RF field is applied to the plasma processing chamber to generate ions and radicals of the oxygen-containing reactant. In various implementations, the RF frequency used to generate the plasma may be at least about 13.56 MHz, at least about 27 MHz, at least about 40 MHz, or at least about 60 MHz, though other frequencies may also be used. In some implementations, the RF power may be a few hundred Watts, for example about 500 W or less, about 400 W or less, or about 300 W or less, though it will be understood that other RF powers may be applied depending on substrate area. In some implementations, the duration of the plasma exposure phase 461B may be between about 0.1 seconds and about 120 seconds or between about 1 second and about 60 seconds.

A plurality of PEALD cycles 410B may be performed to form the second silicon oxide layer on the first silicon oxide layer. The first silicon oxide layer deposited by thermal ALD cycles 410A may provide a liner layer of silicon oxide film to protect underlying layers. In some implementations, the liner layer may be relatively thin and between about 10 Å and about 100 Å thick. In some implementations, the liner layer may serve as a protective liner on soft layers to eliminate or otherwise reduce substrate damage. In some implementations, the liner layer may serve as a high quality liner on high aspect ratio structures. Such high aspect ratio structures may include fins and pillars. The high aspect ratio structures may be prone to bending/damage when exposed to only PEALD operations. However, having the first silicon oxide layer deposited by thermal ALD prior to the second silicon oxide layer provides high conformality, high deposition rate, limited surface oxidation, limited bending of substrate features (e.g., pillars, fins), and uniform wet etch rate on sidewalls. The second silicon oxide layer deposited by PEALD cycles 410B may follow as bulk deposition of silicon oxide film on the liner layer. Accordingly, in various implementations, nucleation of silicon oxide film may be performed by thermal ALD and bulk deposition may be performed by PEALD in the same plasma processing chamber.

In some implementations, the process 300a further includes exposing the substrate to plasma generated from a nitrogen-containing reactant in the plasma processing chamber, where the plasma drives a reaction between reactive species of the nitrogen-containing reactant and at least the second silicon oxide layer, thereby converting at least the second silicon oxide layer to a silicon oxynitride layer. In some implementations, the nitrogen-containing reactant may include nitrogen ($N_2$), ammonia ($NH_3$), or combinations thereof. A nitrogen plasma may cause nitridation of one or both of the first and second silicon oxide layer to form the silicon oxynitride layer.

In addition or in the alternative to the aforementioned nitridation of silicon oxide, the process 300a may include depositing a silicon nitride layer on the first and second silicon oxide layer by thermal ALD or PEALD in the plasma processing chamber. Thus, the combination of the first silicon oxide layer, the second silicon oxide layer, and the silicon nitride layer collectively form a silicon oxynitride film. In various implementations, silicon oxide and silicon nitride layers may be deposited in alternating fashion to form nanolaminates of silicon oxide/silicon nitride. In some implementations, the process 300a further includes annealing the substrate to form the silicon oxynitride film from the first silicon oxide layer, the second silicon oxide layer, and the silicon nitride layer.

Figure 3B:
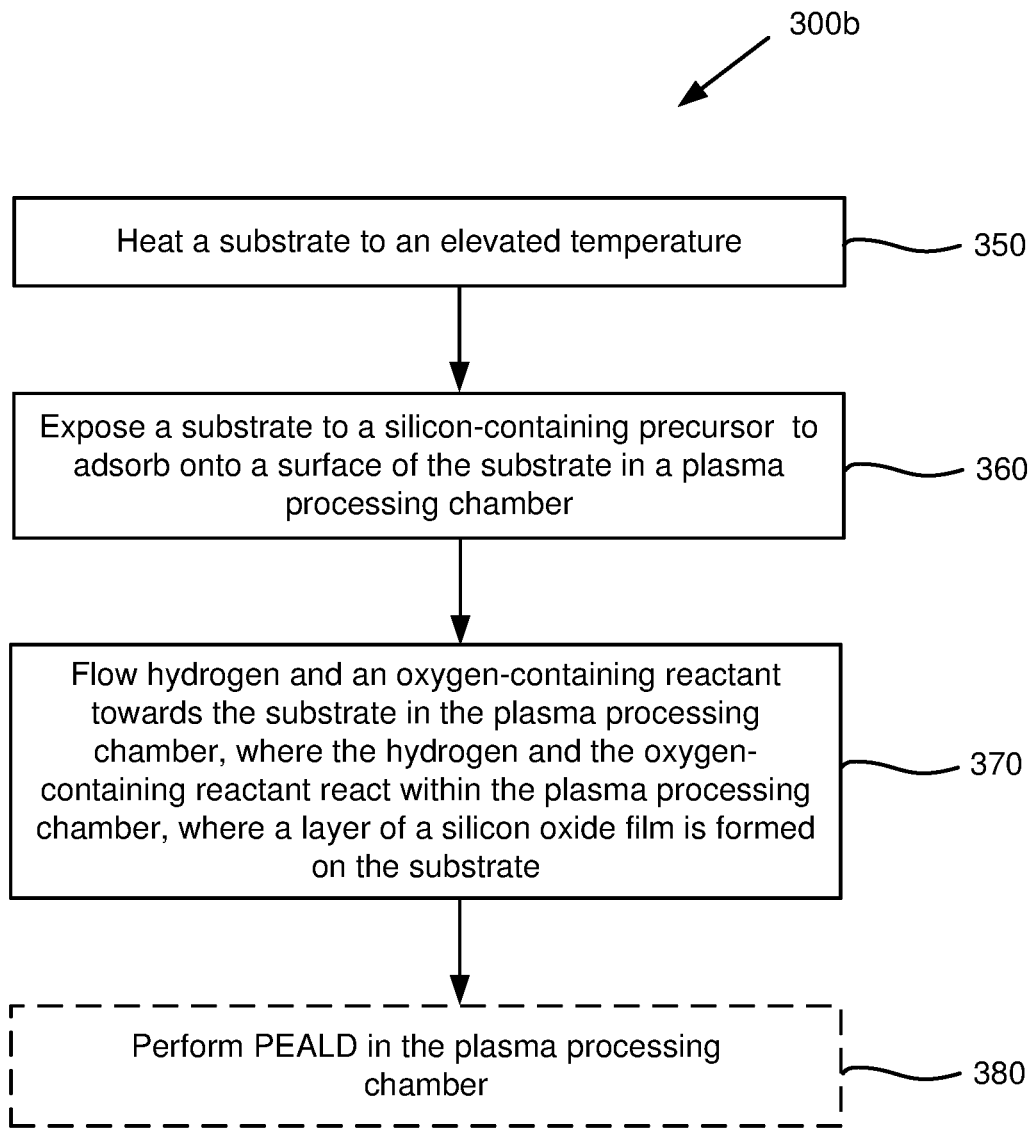
FIG. 3B shows a flow diagram of an example process for depositing a silicon oxide film using thermal ALD according to some implementations.

FIG. 3B shows a flow diagram of an example process for depositing a silicon oxide film using thermal ALD according to some implementations. The operations in a process 300b of FIG. 3B may be performed in different orders and/or with different, fewer, or additional operations. The operations in the process 300b may be performed by a plasma processing apparatus shown in FIG. 11 and/or the process tool shown in FIG. 12. In some implementations, the operations of the process 300b may be implemented, at least in part, according to software stored in one or more non-transitory computer readable media. FIGS. 3B and 5-10 may be described together below.

At block 350 of the process 300b, a substrate is heated to an elevated temperature. The substrate may be heated to the elevated temperature before and during thermal ALD. This allows the substrate to be heated to the elevated temperature to drive surface reactions between precursors and reactants in thermal ALD. In some implementations, the elevated temperature applied to the substrate may be between about 500° C. and about 750° C., between about 500° C. and about 700° C., between about 500° C. and about 650° C., or between about 550° C. and about 650° C. In some implementations, a pressure of a plasma processing chamber may be equal to or greater than about 7 Torr, equal to or greater than about 10 Torr, or equal to or greater than about 12 Torr. Chamber pressure may provide a further knob to control the deposition rate of the layer of silicon oxide film.

In some implementations, prior to heating the substrate to the elevated temperature, the substrate may be provided into the plasma processing chamber. The plasma processing chamber may be a single wafer plasma reactor configured to perform thermal ALD processes, PEALD processes, or combinations thereof. The substrate may be a silicon substrate, such as a 200-mm, 300-mm, or 450-mm substrate, including substrates having one or more layers of material, such as dielectric, conducting, or semiconducting material. In some implementations, the substrate on which silicon oxide films are deposited may include a material that is sensitive to plasma damage by PEALD. For example, the material may include but is not limited to silicon, germanium, silicon-germanium, carbon, and metals, where example metals may include molybdenum, tungsten, copper, cobalt, ruthenium, rhodium, and iridium. The substrate on which the silicon oxide films are deposited may include one or more features such as fins or pillars. In some implementations, the one or more features may include an under-layer such as a barrier layer, liner layer, or adhesion layer.

At block 360 of the process 300b, the substrate is exposed to a silicon-containing precursor to adsorb onto a surface of the substrate in the plasma processing chamber. In some implementations, the silicon-containing precursor includes a silane, such as an aminosilane. An aminosilane includes at least one nitrogen atom bonded to a silicon atom, but may also contain hydrogens, oxygens, halogens and carbons. Examples of aminosilanes may include BTBAS, N-SAM-24, 3DMAS, and 4DMAS. In some implementations, the substrate is exposed to the silicon-containing precursor while the substrate is heated to the elevated temperature.

Figure 5:
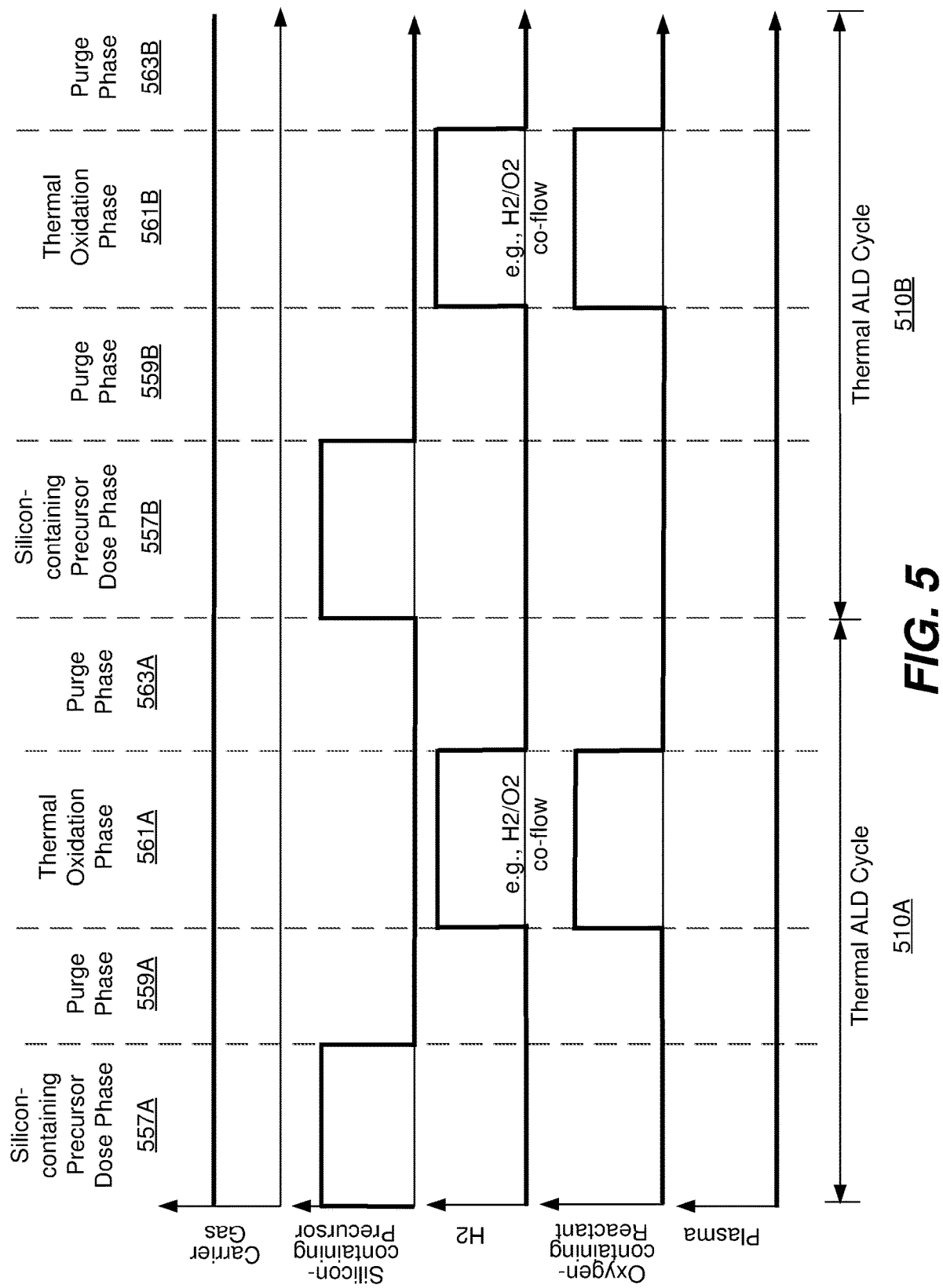
FIG. 5 illustrates an example timing sequence diagram showing thermal ALD cycles for depositing a silicon oxide film with co-flowed hydrogen and an oxygen-containing reactant according to some implementations.

FIG. 5 illustrates an example timing sequence diagram showing thermal ALD cycles for depositing a silicon oxide film with co-flowed hydrogen and an oxygen-containing reactant according to some implementations. A first thermal ALD cycle 510A may include a dose phase 557A, followed by a first purge phase 559A, followed by a thermal oxidation phase 561A, and followed by a second purge phase 563A. A second thermal ALD cycle 510B may include a dose phase 557B, followed by a first purge phase 559B, followed by a thermal oxidation phase 561B, and followed by a second purge phase 563B. As shown in FIG. 5, the substrate may be exposed to the silicon-containing precursor during the dose phase 557A/557B of the thermal ALD cycle 510A/510B, where a duration of the dose phase 557A/557B may be between about 0.1 seconds and about 60 seconds, between about 0.2 seconds and about 6 seconds, or between about 0.3 seconds and about 2 seconds, such as about 0.75 seconds, depending on the flow rate and the substrate surface area. The silicon-containing precursor adsorbs onto the surface of the substrate in a self-limiting manner such that once active sites are occupied by the silicon-containing precursor, little or no additional silicon-containing precursor will be adsorbed on the surface of the substrate. During the dose phase 557A/557B, plasma is turned off, no oxygen-containing reactant is flowed to the substrate, and a carrier gas may be flowed towards the substrate.

In some implementations, the plasma processing chamber may be purged between operations of exposing the substrate to the silicon-containing precursor and flowing hydrogen and an oxygen-containing reactant into the plasma processing chamber. In addition, the plasma processing chamber may be purged after the flow of hydrogen and oxygen-containing reactant has ceased. Purging may involve a sweep gas, which may be a carrier gas used in other operations/phases or a different gas. Purging may remove excess species in the vapor phase that did not adsorb or react on the surface of the substrate. As shown in FIG. 5, the plasma processing chamber undergoes purging during purge phases 559A, 563A, 559B, and 563B. Silicon-containing precursor flow is turned off, plasma is turned off, hydrogen flow is turned off, and oxygen-containing reactant flow is turned off. However, the carrier gas may continue to flow towards the substrate. In some implementations, the purge phases 559A, 563A, 559B, and 563B may each include one or more evacuation sub-phases for evacuating the plasma processing chamber. Alternatively, it will be appreciated that each of the purge phases 559A, 563A, 559B, and 563B may be omitted in some implementations. Each purge phase 559A, 563A, 559B, and 563B may have a suitable duration, such as between about 0 seconds and about 60 seconds or between about 0.01 seconds and about 6 seconds.

Returning to FIG. 3B, at block 370 of the process 300*b*, hydrogen and oxygen-containing reactant are flowed towards the substrate in the plasma processing chamber. The hydrogen and the oxygen-containing reactant react within the plasma processing chamber, where a layer of a silicon oxide film is formed on the substrate. The hydrogen and oxygen-containing reactant may be flowed simultaneously into the plasma processing chamber. In some implementations, the oxygen-containing reactant includes oxygen or ozone. For example, the oxygen-containing reactant includes oxygen, thereby providing a co-flow of hydrogen and oxygen ($H_2/O_2$). Without being limited by any theory, the hydrogen and the oxygen-containing reactant react in situ with one another within the plasma processing chamber in an exothermic reaction. It is possible that the reaction between the hydrogen and the oxygen-containing reactant forms water in the exothermic reaction. The exothermic reaction releases energy that may drive the thermal oxidation of the adsorbed silicon-containing precursor to form silicon oxide film. The flow rate of hydrogen and the flow rate of the oxygen-containing reactant may be controlled according to a desired flow rate ratio to promote thermal oxidation. In some implementations, a flow rate ratio between hydrogen and the oxygen-containing reactant may be equal to or less than about 1.2:1, such as between about 0.5:1 and about 1.2:1. In some implementations, a flow rate of hydrogen may be between about 0 slm and about 20 slm, between about 1 slm and about 10 slm, between about 2 slm and about 6 slm, greater than about 3 slm, such as about 4 slm. A flow rate of oxygen-containing reactant may be between about 0.5 slm and about 20 slm, between about 1 slm and about 10 slm, or between about 2 slm and about 8 slm, such as about 5 slm.

During the flow of hydrogen and the oxygen-containing reactant, the substrate is maintained at the elevated temperature. The substrate is at the elevated temperature while the hydrogen and oxygen-containing reactant are flowing towards the substrate to drive a reaction with the adsorbed silicon-containing precursor in the plasma processing chamber, thereby forming the layer of the silicon oxide film. The elevated temperature may promote formation of the layer of the silicon oxide film at an appreciable deposition rate. Without being limited by any theory, the in situ exothermic reaction between hydrogen and the oxygen-containing reactant along with the heated substrate at the elevated temperature may provide sufficient energy to drive the formation of the layer of the silicon oxide film at an appreciable deposition rate. In some implementations, the deposition rate of the layer of the silicon oxide film using co-flowed hydrogen and oxygen-containing reactant may be equal to or greater than about 0.7 Å/cycle.

As shown in FIG. 5, hydrogen and oxygen-containing reactant may be flowed towards the substrate while the substrate is heated at the elevated temperature during a thermal oxidation phase 561A/561B of the thermal ALD cycle 510A/510B. The in situ exothermic reaction between the hydrogen and oxygen-containing reactant combined with the substrate heated at the elevated temperature may provide energy for driving oxidation during the thermal oxidation phase 561A/561B. Moreover, temperature and pressure in the plasma processing chamber may be controlled to enable the deposition of the layer of the silicon oxide film at a deposition rate equal to or greater than about 0.7 Å/cycle during the thermal oxidation phase 561A/561B. A duration of the thermal oxidation phase 561A/561B may be between about 0.1 seconds and about 6 seconds, between about 0.2 seconds and about 4 seconds, or between about 0.5 seconds and about 3 seconds. For example, the duration of the thermal oxidation phase 561A/561B with co-flowed hydrogen and oxygen-containing reactant may be between about 0.5 seconds and about 1 second, such as about 0.8 seconds. During the thermal oxidation phase 561A/561B, plasma is turned off and silicon-containing precursor flow is turned off. However, carrier gas, hydrogen, and oxygen-containing reactant flow may be turned on.

Example process times and process conditions are shown in Table 1 for co-flowed hydrogen and oxygen in thermal ALD.

TABLE 1

| Process Times | Dose | 0.2-2 seconds |
|---|---|---|
| | Post-Dose Purge | 0.15-2 seconds |
| | Conversion Time | 0.5-2 seconds |
| | Post-Oxidation Time | 0-1 second |
| Process | Silicon-Containing | 1500 sccm |

TABLE 1-continued

| Conditions | | |
|---|---|---|
| Precursor Flow | | |
| Purge Gas Flow | 25000-65000 sccm | |
| O2 Flow | 2000-5000 sccm | |
| H2 flow | 2000-5000 sccm | |
| Pressure | 9 Torr-17.5 Torr | |
| Temperature | 500° C.-750° C. | |
| Purge Gas | Ar and/or N2 | |

In some implementations, the process 300b further includes applying plasma power to the plasma processing chamber to ignite plasma generated from the hydrogen and oxygen-containing reactant in the plasma processing chamber. In some implementations, the plasma may include ions, radicals, and other reactive species of hydrogen and oxygen (e.g., H* and O*). In some implementations, the plasma may further include ions, radicals, and other reactive species of the carrier gas (e.g., Ar*). The plasma power applied to the plasma processing chamber may be relatively small. In some implementations, the plasma power applied to the plasma processing chamber is equal to or less than about 300 W, equal to or less than about 200 W, or between about 10 W and about 200 W. That way, the plasma may include more radicals and fewer ions. In various implementations, the RF frequency used to generate the plasma may be at least about 13.56 MHz, at least about 27 MHz, at least about 40 MHz, or at least about 60 MHz, though other frequencies may also be used.

Without being limited by any theory, low RF power may ignite low RF plasma with energy from the exothermic reaction between the hydrogen and the oxygen-containing reactant. Without an in situ exothermic reaction between hydrogen and the oxygen-containing reactant, plasma may not be ignited at relatively low RF powers. In other words, a combustion reaction of hydrogen and the oxygen-containing reactant may contribute to generating low RF plasma in the plasma processing chamber. A stable plasma may be maintained at relatively low RF powers. The low RF plasma may limit damage to the substrate and particularly limit damage to any sensitive substrate. The low RF plasma may enhance or at least modulate deposition and properties of the layer of silicon oxide film. In some implementations, the low RF plasma may modulate deposition rate and provide higher wet etch rates. In some implementations, the low RF plasma may provide more conformal films, lower operating temperatures, and/or higher deposition rates.

Figure 6:
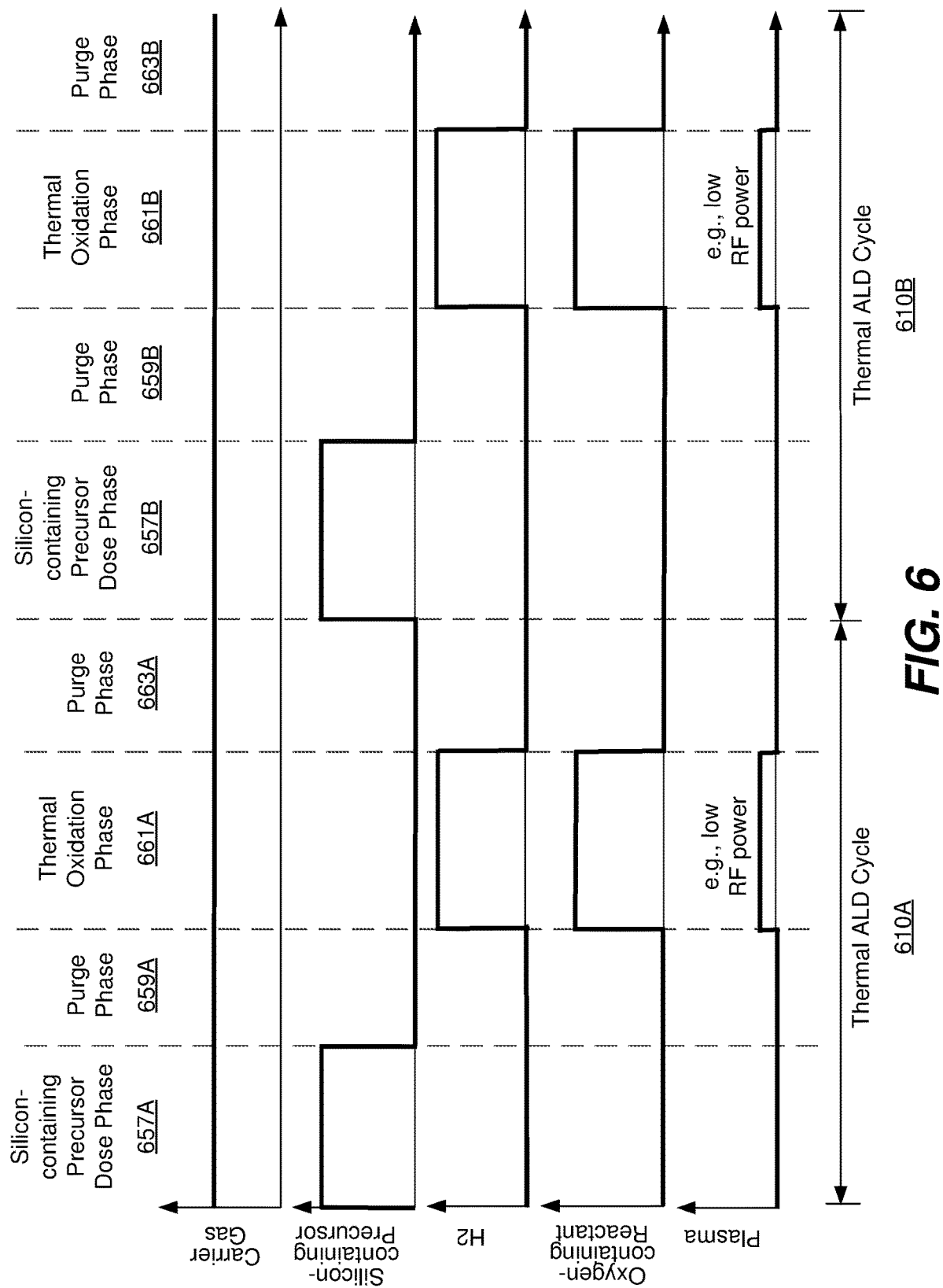
FIG. 6 illustrates an example timing sequence diagram showing thermal ALD cycles for depositing a silicon oxide film with low RF plasma power according to some implementations.

FIG. 6 illustrates an example timing sequence diagram showing thermal ALD cycles for depositing a silicon oxide film with low RF plasma power according to some implementations. FIG. 6 shows a first thermal ALD cycle 610A that includes a dose phase 657A, first purge phase 659A, thermal oxidation phase 661A, and second purge phase 663A. FIG. 6 also shows a second thermal ALD cycle 610B that includes a dose phase 657B, first purge phase 659B, thermal oxidation phase 661B, and second purge phase 663B. Aspects of the phases for each of the thermal ALD cycles 610A/610B of FIG. 6 can be described in the thermal ALD cycles 510A/510B of FIG. 5.

In the thermal oxidation phase 661A/661B, plasma is turned on rather than off. The plasma power can be a low RF plasma power that is equal to or less than about 300 W, equal to or less than about 200 W, or between about 10 W and about 200 W. Application of the low RF plasma power occurs while hydrogen and oxygen-containing reactant are being flowed toward the substrate and while the substrate is heated at the elevated temperature. Reactive species in the plasma such as radicals of oxygen may react with the adsorbed silicon-containing precursor to form silicon oxide.

In some implementations at block 370 of the process 300b, flowing hydrogen and oxygen-containing reactant towards the substrate may include flowing the oxygen-containing reactant continuously into the plasma processing chamber and pulsing hydrogen at regular intervals into the plasma processing chamber. The hydrogen may be pulsed at regular intervals while the oxygen-containing reactant is simultaneously and continuously flowed towards the substrate. For example, a constant oxygen flow may be combined with pulsed hydrogen flow into the plasma processing chamber. In some implementations, pulses of hydrogen may be introduced into the plasma processing chamber at regular intervals that last between about 0.1 seconds and about 1 second, between about 0.1 seconds and about 0.8 seconds, or between about 0.2 seconds and about 0.6 seconds. Pulsing hydrogen may facilitate combustion reactions of hydrogen and oxygen-containing reactant that occur in pulses rather than continuously. Pulsing hydrogen may affect the deposition and properties of the layer of silicon oxide film. When pulsing hydrogen, the duration of the thermal oxidation phase may be longer. Without being limited by any theory, this permits pulsed exothermic reaction(s) to proceed for as long as desired to drive film properties.

Figure 7:
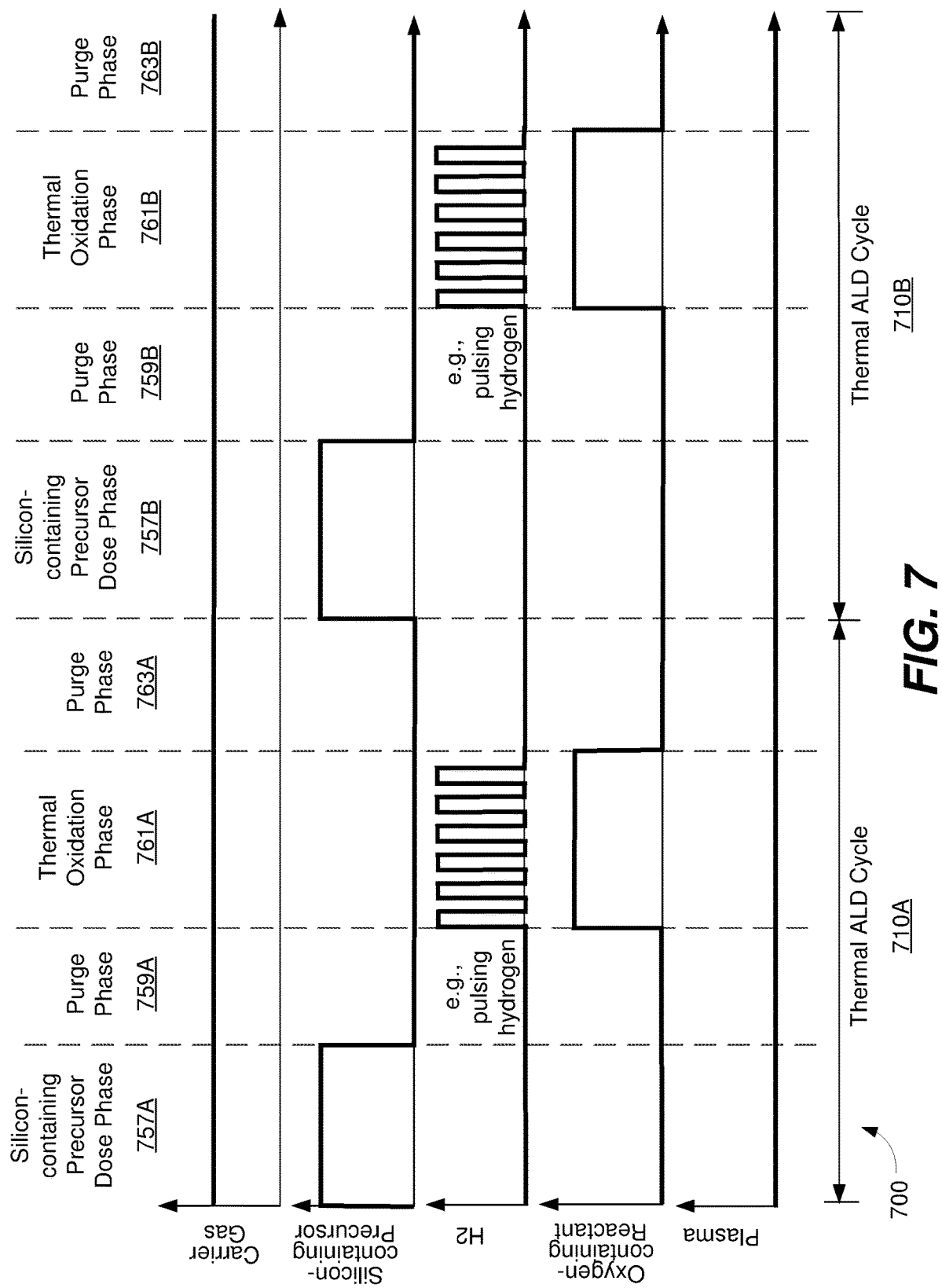
FIG. 7 illustrates an example timing sequence diagram showing thermal ALD cycles for depositing a silicon oxide film with pulsing hydrogen flow during oxidation according to some implementations.

FIG. 7 illustrates an example timing sequence diagram showing thermal ALD cycles for depositing a silicon oxide film with pulsing hydrogen flow during oxidation according to some implementations. FIG. 7 shows a first thermal ALD cycle 710A that includes a dose phase 757A, first purge phase 759A, thermal oxidation phase 761A, and second purge phase 763A. FIG. 7 also shows a second thermal ALD cycle 710B that includes a dose phase 757B, first purge phase 759B, thermal oxidation phase 761B, and second purge phase 763B. Aspects of the phases for each of the thermal ALD cycles 710A/710B of FIG. 7 can be described in the thermal ALD cycles 510A/510B of FIG. 5.

In the thermal oxidation phase 761A/761B, hydrogen flow is pulsed rather than continuous. Oxygen-containing reactant flow is continuous and simultaneous with the pulsed hydrogen flow. Typically, pulses in the pulsed hydrogen flow can be in the form of a square waveform. The pulses in the pulsed hydrogen flow can occur in regular intervals, where each of the regular intervals can last between about 0.1 seconds and about 1 second, between about 0.1 seconds and about 0.8 seconds, or between about 0.2 seconds and about 0.6 seconds. In some implementations, a total duration of the thermal oxidation phase 761A/761B may be equal to or greater than 0.5 seconds, equal to or greater than 1 second, or between about 1 second and about 30 seconds. It will be understood that the total duration of the thermal oxidation phase 761A/761B may be longer to permit pulsed exothermic reactions to drive film properties. A duty cycle can refer to the percentage of on time ($T_{on}$) that flow is turned on during the total of on and off time, where $T=T_{on}+T_{off}$ during the thermal oxidation phase 761A/761B. In some implementations, the duty cycle of the pulsed hydrogen flow can be between about 1% and about 99%, between about 5% and about 95%, between about 15% and about 90%, or between about 25% and about 75%.

In some implementations at block 370 of the process 300b, flowing hydrogen and oxygen-containing reactant towards the substrate may include generating oxygen radicals from the oxygen-containing reactant in a remote plasma source, introducing the radicals of oxygen into the plasma processing chamber, and flowing the hydrogen into the plasma processing chamber. Instead of pure oxygen gas, the radicals of oxygen may provide more reactive species to react with the hydrogen and the adsorbed silicon-containing precursor. Without being limited by any theory, the radicals of oxygen may react with hydrogen to form hydroxyl radicals or water, where the hydroxyl radicals or water may promote oxidation of the adsorbed silicon-containing precursor. In some implementations, the oxygen radicals are generated from oxygen gas or ozone. In some implementations, remote plasma source is located upstream of the plasma processing chamber, where the remote plasma source can be any suitable plasma generator such as an inductively-coupled plasma generator or capacitively-coupled plasma generator.

Figure 8:
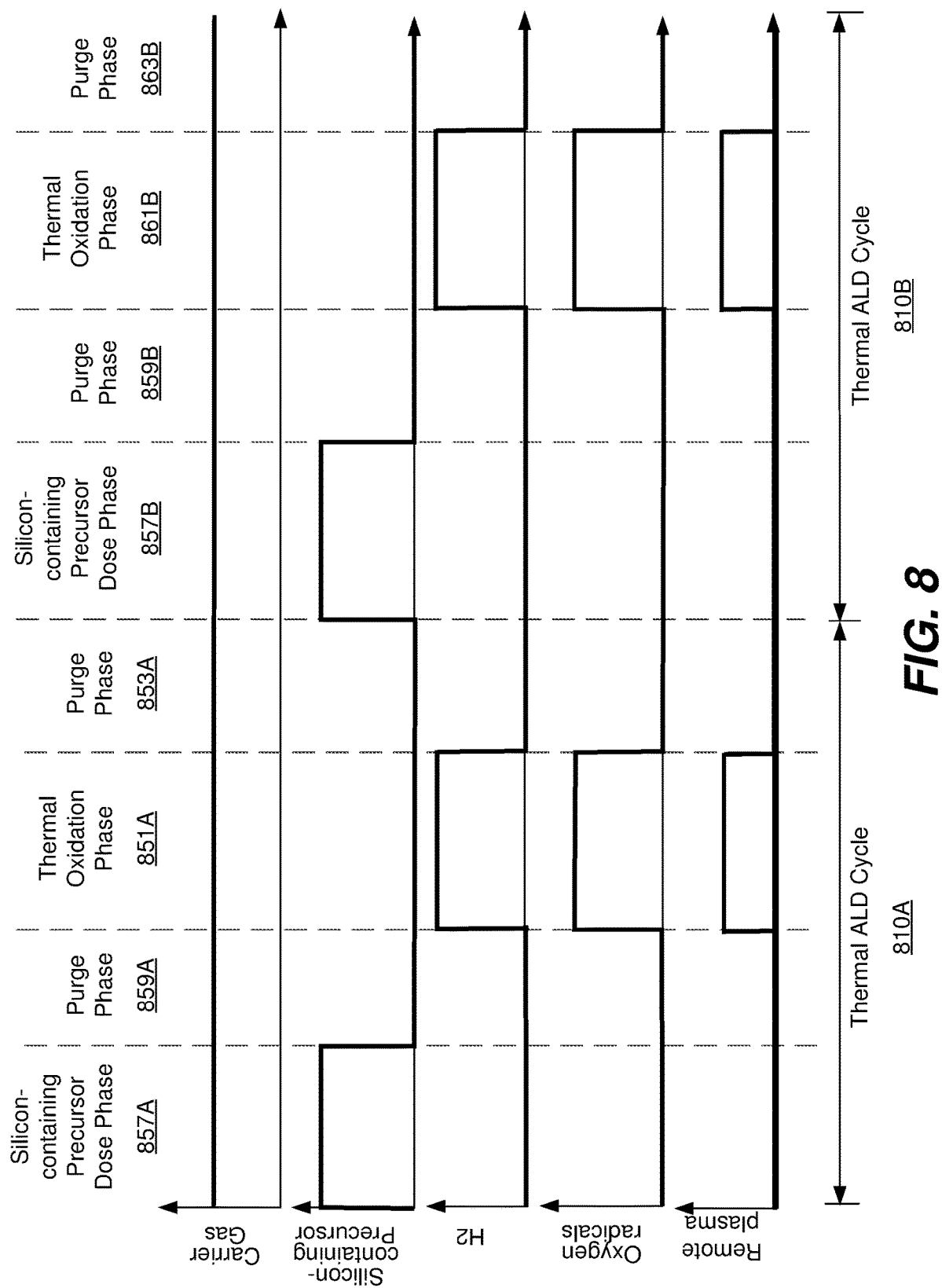
FIG. 8 illustrates an example timing sequence diagram showing thermal ALD cycles for depositing a silicon oxide film with oxygen radicals generated from a remote plasma source during oxidation according to some implementations.

FIG. 8 illustrates an example timing sequence diagram showing thermal ALD cycles for depositing a silicon oxide film with oxygen radicals generated from a remote plasma source during oxidation according to some implementations. FIG. 8 shows a first thermal ALD cycle 810A that includes a dose phase 857A, first purge phase 859A, thermal oxidation phase 861A, and second purge phase 863A. FIG. 8 also shows a second thermal ALD cycle 810B that includes a dose phase 857B, first purge phase 859B, thermal oxidation phase 861B, and second purge phase 863B. Aspects of the phases for each of the thermal ALD cycles 810A/810B of FIG. 8 can be described in the thermal ALD cycles 510A/510B of FIG. 5.

In the thermal oxidation phase 861A/861B, oxygen radicals are introduced into the plasma processing chamber instead of pure oxygen gas. Hydrogen flow may be continuous and simultaneous with the flow of oxygen radicals into the plasma processing chamber. However, it will be understood that in some implementations, hydrogen flow may be pulsed. In the thermal oxidation phase 861A/861B, remote plasma power is turned on rather than off. RF power may be applied to a remote plasma source to generate the oxygen radicals upstream from the plasma processing chamber.

In some implementations, at block 380 of the process 300b, the process 300b further includes performing PEALD in the plasma processing chamber. For example, the process 300b can include depositing one or more additional layers of the silicon oxide film on the substrate via PEALD in the plasma processing chamber. In addition or in the alternative, the process 300b can include depositing one or more layers of a silicon nitride film on the layer of the silicon oxide film by thermal ALD or PEALD in the plasma processing chamber to ultimately form a silicon oxynitride film. In some implementations, at block 380 of the process 300b, a PEALD cycle can include exposing the substrate to plasma of a nitrogen-containing reactant to convert the layer of the silicon oxide film to a silicon oxynitride film during a plasma exposure phase. The layer of silicon oxide film deposited by thermal ALD may serve as a liner layer protecting underlying layers of the substrate, and subsequent layers of silicon oxide and/or silicon nitride may be deposited in bulk over the liner layer. The layer of silicon oxide film deposited by thermal ALD may exhibit high conformality, high deposition rate, limited surface oxidation, limited bending of substrate features (e.g., pillars, fins), and uniform wet etch rate on sidewalls. In some implementations, however, performing PEALD in the plasma processing chamber may occur before thermal ALD in the plasma processing chamber. In other words, layers of silicon oxide film may be deposited by PEALD and followed by additional layers of silicon oxide film deposited by thermal ALD.

Figure 9:
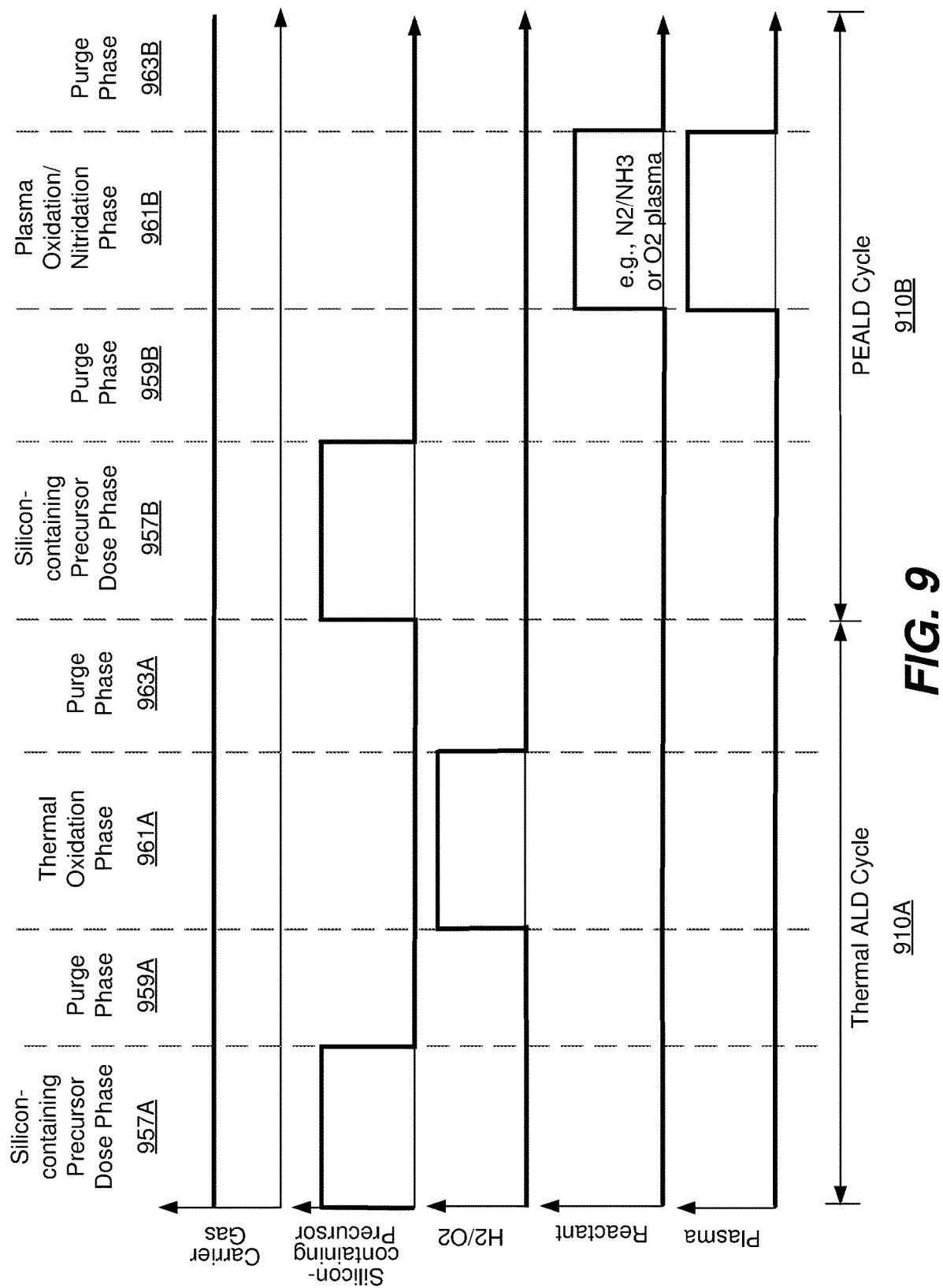
FIG. 9 illustrates an example timing sequence diagram showing a thermal ALD cycle with co-flowed hydrogen and oxygen followed by a PEALD cycle with plasma oxidation/nitridation for depositing a silicon oxide film according to some implementations.

FIG. 9 illustrates an example timing sequence diagram showing a thermal ALD cycle with co-flowed hydrogen and oxygen followed by a PEALD cycle with plasma oxidation/nitridation for depositing a silicon-containing film according to some implementations. However, it will be understood that the PEALD cycle may be performed prior to the thermal ALD cycle in some implementations. FIG. 9 shows a thermal ALD cycle 910A that includes a dose phase 957A, a first purge phase 959A, a thermal oxidation phase 961A, and a second purge phase 963A. FIG. 9 also shows a PEALD cycle 910B that includes a dose phase 957B, first purge phase 959B, plasma oxidation/nitridation phase 961B, and second purge phase 963B. Aspects of the phases for the thermal ALD cycle 910A of FIG. 9 can be described in the thermal ALD cycle 510A/510B of FIG. 5. Aspects of the phases for the PEALD cycle 910B of FIG. 9 can be described in the PEALD cycle 410B of FIG. 4.

In the plasma oxidation/nitridation phase 961B, the substrate may be exposed to an oxygen plasma or nitrogen plasma. If plasma nitridation takes place, one or more nitrogen-containing reactants may be flowed towards the substrate and plasma turned on. For example, the one or more nitrogen-containing reactants may include $N_2/NH_3$. The plasma nitridation may deposit a layer of silicon nitride film over the layer of silicon oxide film. In some implementations, the plasma nitridation may convert silicon oxide to silicon oxynitride. If plasma oxidation takes place, one or more oxygen-containing reactants may be flowed towards the substrate and plasma turned on. For example, the one or more oxygen-containing reactants may include $O_2$. The plasma oxidation may deposit an additional layer of silicon oxide film over the layer of silicon oxide film.

In some implementations, at blocks 360 and 370 of the process 300b, exposing the substrate to the silicon-containing precursor and flowing the hydrogen and oxygen-containing reactant may occur in a continuous manner rather than in a cyclic manner Specifically, exposing the substrate to the silicon-containing precursor and flowing the hydrogen and oxygen-containing reactant occurs in a thermal CVD process instead of a thermal ALD process. Briefly, thermal ALD reactions involve cyclically performing (a) delivery of precursor to form an adsorbed precursor layer, (b) optional purge operation, (c) delivery of reactant(s) on a heated substrate, (d) optional purge operation, and (e) repeating operations (a)-(d) until the film reaches a desired thickness. However, thermal CVD reactions involve delivering the precursor and reactant(s) continuously while the substrate is heated. CVD reactions are gas phase reactions, which deposition reaction products on the substrate surface. Hence, the reaction mechanism of the present disclosure may involve thermal CVD using silicon-containing precursor, hydrogen, and oxygen-containing reactant being delivered continuously rather than cyclically in thermal ALD.

Figure 10:
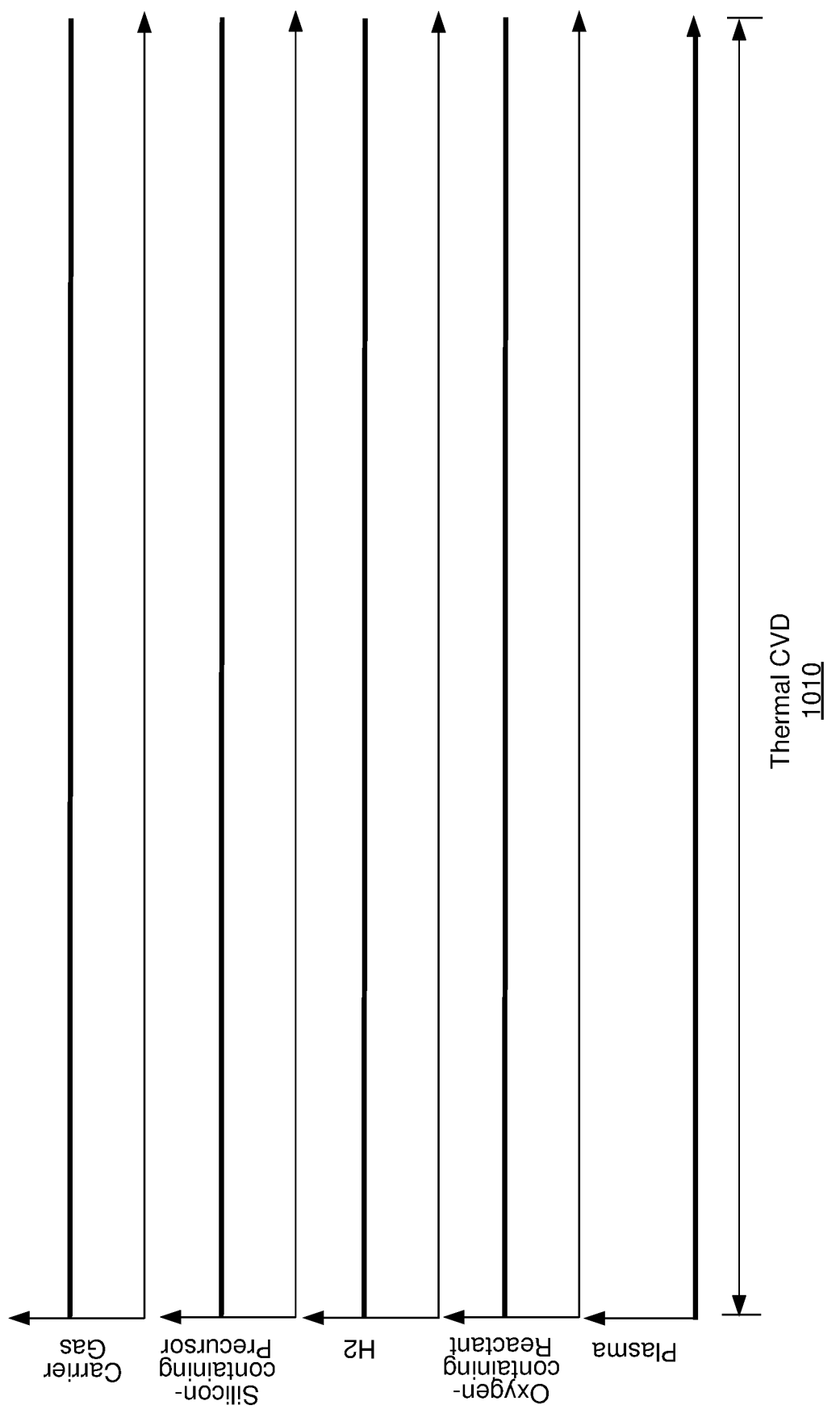
FIG. 10 illustrates an example timing sequence diagram showing thermal CVD with co-flowed silicon-containing precursor, hydrogen, and oxygen-containing reactant for depositing a silicon oxide film according to some implementations.

FIG. 10 illustrates an example timing sequence diagram showing thermal CVD with co-flowed silicon-containing precursor, hydrogen, and oxygen-containing reactant for depositing a silicon-containing film according to some implementations. A thermal CVD process 1010 is not broken down into a series of phases in cycles. Carrier gas is continuously flowed to the substrate, silicon-containing precursor is continuously flowed to the substrate, hydrogen gas is continuously flowed to the substrate, and oxygen-containing reactant is continuously flowed to the substrate. Delivery of the silicon-containing precursor, delivery of hydrogen, and delivery of the oxygen-containing reactant do not occur sequentially and do not occur in separate phases. Plasma is turned off during the thermal CVD process 1010.

It will be understood that any of the foregoing techniques described in FIGS. 4-10 may be mixed together in a series of ALD cycles and/or CVD reactions. In other words, deposition of a silicon-containing film by thermal ALD may involve one or more cycles with pulsed hydrogen flow, one or more cycles with co-flowed hydrogen and oxygen-containing reactant, one or more cycles with application of low RF power, one or more cycles with oxygen radicals, one or more PEALD cycles for plasma oxidation/nitridation, and one or more periods of thermal CVD reactions with a silicon-containing precursor, hydrogen, and oxygen-containing reactant. Such techniques may be applied in any sequence when depositing the silicon-containing film.

Apparatus

The methods described herein may be performed by any suitable apparatus or combination of apparatus. A suitable apparatus includes hardware for accomplishing the process operations and a system controller having instructions for controlling process operations in accordance with the present disclosure. For example, in some implementations, the hardware may include one or more process stations included in a process tool. In the present disclosure, the thermal ALD/CVD and PEALD/PECVD may be performed in a single station/chamber.

Figure 11:
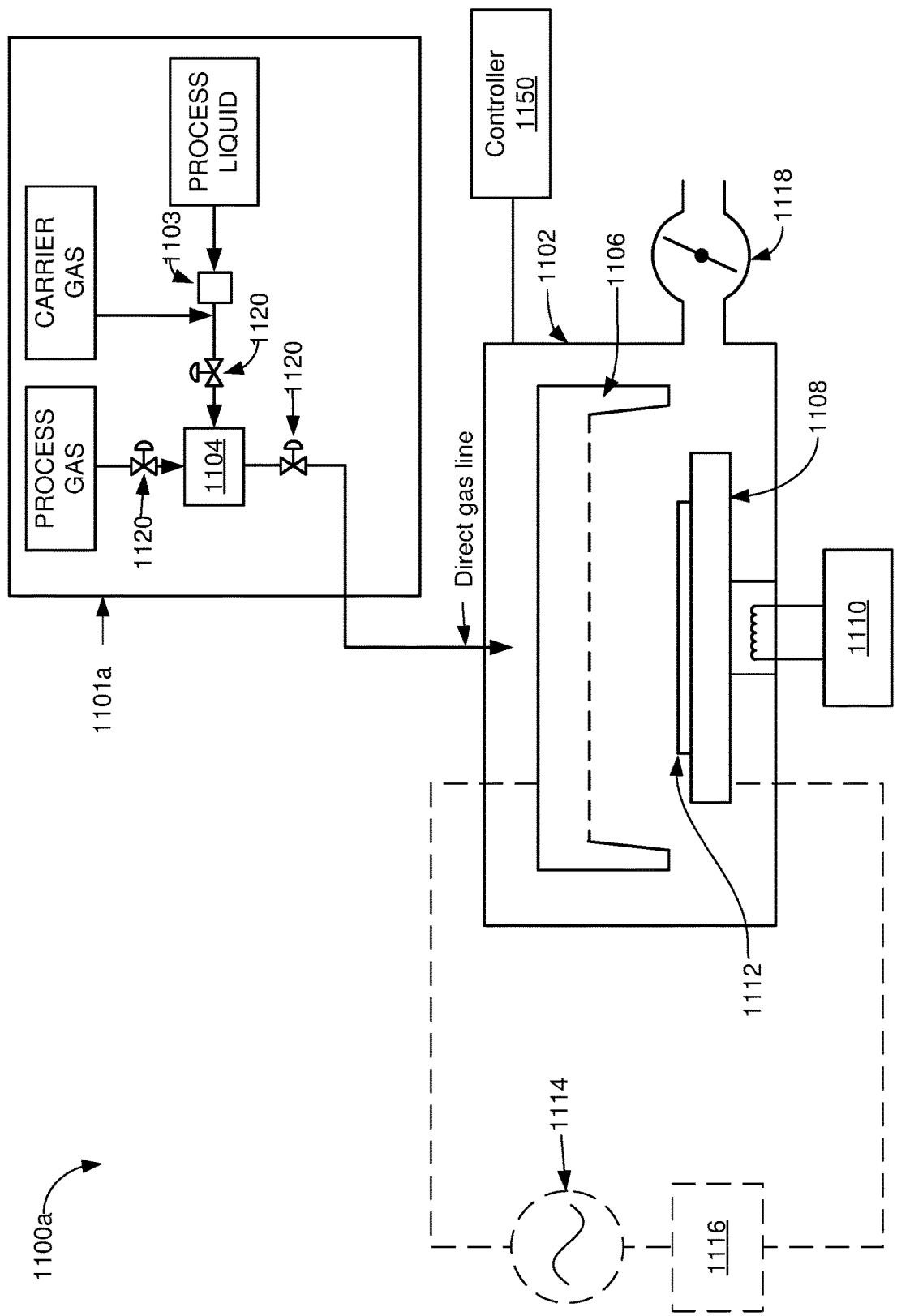
FIG. 11 is a schematic diagram of an example plasma processing apparatus for depositing a silicon oxide film using thermal ALD according to some implementations.
Figure 12:
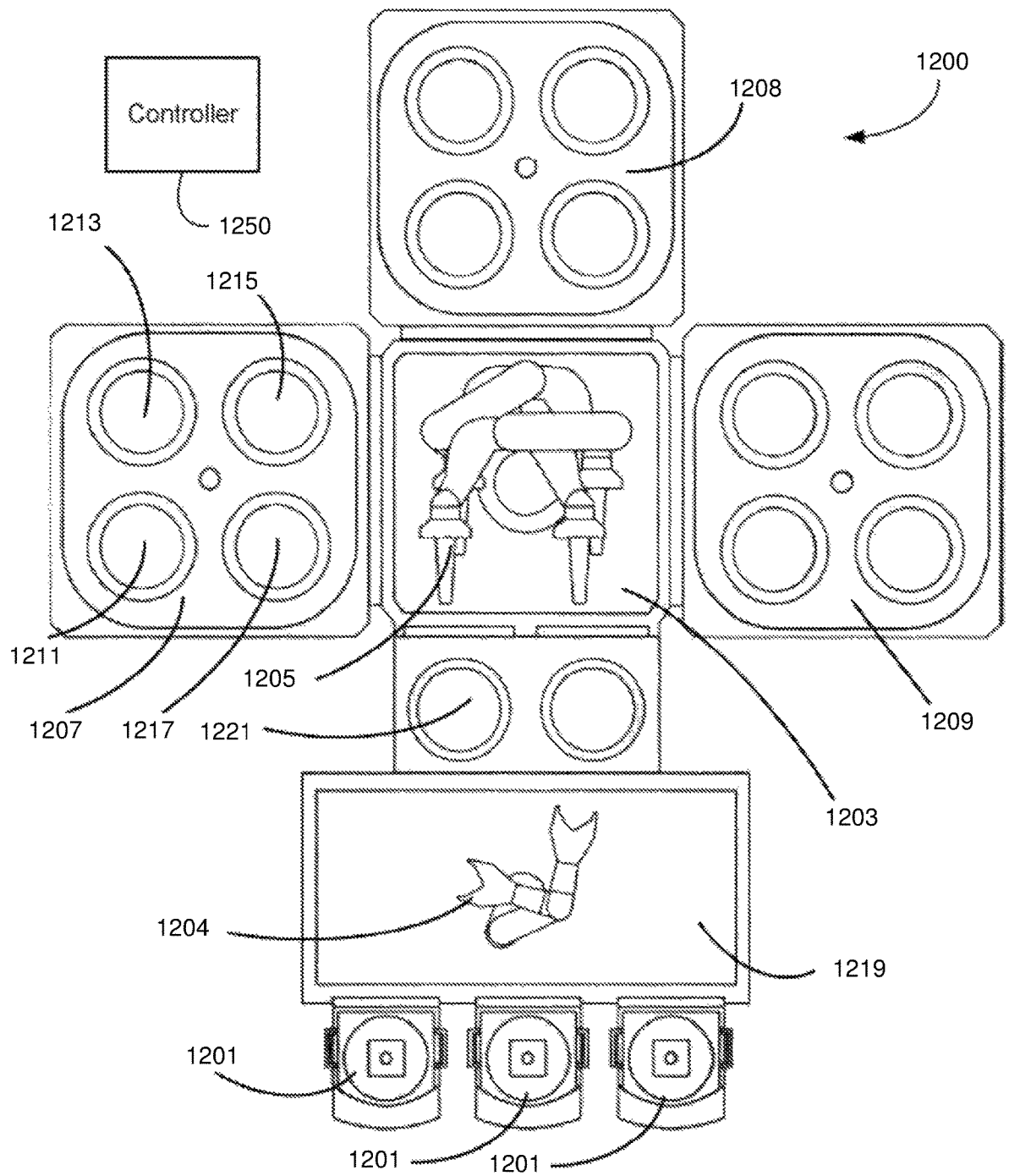
FIG. 12 is a schematic diagram of an example process tool for performing the disclosed implementations.

FIG. 11 is a schematic diagram of an example plasma processing apparatus for depositing a silicon-containing film using thermal ALD according to some implementations. The plasma apparatus or process station 1100a includes a plasma processing chamber 1102 for maintaining a low-pressure environment. A plurality of plasma apparatuses or process stations 1100a may be included in a common low-pressure process tool environment. For example, FIG. 12 depicts an implementation of a multi-station processing tool 1200. In some implementations, one or more hardware parameters of the plasma apparatus or process station 1100a including those discussed in detail below may be adjusted programmatically by one or more system controllers 1150. The plasma apparatus or process station 1100a can be configured to perform thermal ALD and PEALD, thermal CVD and PEALD, thermal ALD and PECVD, or thermal CVD and PECVD. In some implementations, the plasma apparatus or process station 1100a can be configured to perform one or more PEALD cycles and one or more thermal ALD cycles to deposit a silicon oxide film on a substrate 1112.

The apparatus or process station 1100a fluidly communicates with reactant delivery system 1101a for delivering process gases to a distribution showerhead 1106. Reactant delivery system 1101a includes a mixing vessel 1104 for blending and/or conditioning process gases, such as a silicon-containing precursor in the vapor phase, for delivery to showerhead 1106. In some implementations, the reactant delivery system 1101a includes a mixing vessel 1104 for blending and/or conditioning an oxygen-containing reactant (e.g., oxygen) for delivery to the showerhead 1106. In some implementations, the reactant delivery system 1101a includes a mixing vessel 1104 for blending and/or conditioning hydrogen and an oxygen-containing reactant (e.g., oxygen) for delivery to the showerhead 1106. One or more mixing vessel inlet valves 1120 may control introduction of process gases to mixing vessel 1104. Plasma of the oxygen-containing reactant may also be delivered to the showerhead 1106 or may be generated in the plasma apparatus or process station 1100a. The showerhead 1106 may be fluidly coupled to the plasma processing chamber 1102 for delivery of silicon-containing precursors and reactants into the plasma processing chamber 1102.

As an example, the implementation of FIG. 11 includes a vaporization point 1103 for vaporizing liquid reactant to be supplied to the mixing vessel 1104. In some implementations, vaporization point 1103 may be a heated vaporizer. In some implementations, delivery piping downstream of vaporization point 1103 may be heat traced. In some examples, the mixing vessel 1104 may also be heat traced. In one non-limiting example, piping downstream of vaporization point 1103 has an increasing temperature profile extending from approximately 100° C. to approximately 150° C. at the mixing vessel 1104. In some implementations, liquid precursor or liquid reactant may be vaporized at a liquid injector. For example, a liquid injector may inject pulses of a liquid reactant into a carrier gas stream upstream of the mixing vessel 1104. In one implementation, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1103. In one scenario, a liquid injector may be mounted directly to mixing vessel 1104. In another scenario, a liquid injector may be mounted directly to showerhead 1106.

In some implementations, a liquid flow controller (LFC) upstream of vaporization point 1103 may be provided for controlling a mass flow of liquid for vaporization and delivery to the plasma apparatus or process station 1100a. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some implementations, the LFC may be dynamically switched between a feedback control mode and a direct control mode. In some implementations, this may be performed by disabling a sense tube of the LFC and the PID controller.

The showerhead 1106 distributes process gases toward a substrate 1112. In the implementation shown in FIG. 11, the substrate 1112 is located beneath the showerhead 1106 and is shown resting on a substrate support 1108, where the substrate support 1108 is configured to support the substrate 1112. The substrate support 1108 may include a chuck, a fork, or lift pins (not shown) to hold and transfer the substrate 1112 during and between the deposition operations. The chuck may be an electrostatic chuck, a mechanical chuck, or various other types of chuck as are available for use in the industry and/or for research. The showerhead 1106 may have any suitable shape, and may have any suitable number and arrangement of ports for distributing process gases to the substrate 1112.

In some implementations, the substrate support 1108 may be raised or lowered to expose the substrate 1112 to a volume between the substrate 1112 and the showerhead 1106. It will be appreciated that, in some implementations, substrate support height may be adjusted programmatically by a suitable system controller 1150.

In another scenario, adjusting a height of the substrate support 1108 may allow a plasma density to be varied during plasma activation cycles included in the process. At the conclusion of a processing phase, the substrate support 1108 may be lowered during another substrate transfer phase to allow removal of the substrate 1112 from the substrate support 1108.

In some implementations, the substrate support 1108 may be configured to be heated to an elevated temperature via a heater 1110. In some implementations, the substrate support 1108 may be heated to a temperature less than about 700° C., such as about between about 500° C. and about 750° C. or between about 500° C. and about 650° C., during deposition of silicon oxide films as described in the disclosed implementations. Further, in some implementations, pressure control for the apparatus or process station 700a may be provided by a butterfly valve 1118. As shown in the implementation of FIG. 11, the butterfly valve 1118 throttles a vacuum provided by a downstream vacuum pump (not shown). However, in some implementations, pressure control of the plasma processing chamber 1102 may also be adjusted by varying a flow rate of one or more gases introduced to the plasma processing chamber 1102.

In some implementations, the pressure in the plasma processing chamber 1102 may be controlled to be equal to or greater than about 7 Torr, equal to or greater than about 10 Torr, or equal to or greater than about 12 Torr during deposition of silicon oxide films as described in the disclosed implementations.

In some implementations, a position of the showerhead 1106 may be adjusted relative to the substrate support 1108 to vary a volume between the substrate 1112 and the showerhead 1106. Further, it will be appreciated that a vertical position of substrate support 1108 and/or showerhead 1106 may be varied by any suitable mechanism within the scope of the present disclosure. In some implementations, the substrate support 1108 may include a rotational axis for rotating an orientation of the substrate 1112. It will be appreciated that, in some implementations, one or more of these example adjustments may be performed programmatically by one or more suitable system controllers 1150.

In some implementations where plasma may be used as discussed above, showerhead 1106 and substrate support 1108 electrically communicate with a radio frequency (RF) power supply 1114 and matching network 1116 for powering a plasma in the plasma processing chamber 1102. In some implementations, the plasma energy may be controlled by controlling one or more of a process station pressure, a gas concentration, an RF source power, an RF source frequency, and a plasma power pulse timing. For example, RF power supply 1114 and matching network 1116 may be operated at any suitable power to form a plasma having a desired composition of radical species. In some implementations, the RF power supply 1114 and matching network 1116 may be operated to apply plasma power to the plasma processing chamber 1102 to ignite plasma generated from hydrogen and oxygen-containing reactant in the plasma processing chamber 1102. Example plasma powers applied by the RF power supply 1114 may be equal to or less than about 300 W, equal to or less than about 200 W, or between about 10 W and about 200 W. Likewise, RF power supply 1114 may provide RF power of any suitable frequency. In some implementations, RF power supply 1114 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or at least about 13.56 MHz, or at least about 27 MHz, or at least about 40 MHz, or at least about 60 MHz. It will be appreciated that any suitable parameters may be modulated discretely or continuously to provide plasma energy for the surface reactions.

In some implementations, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some implementations, one or more plasma parameters may be programmatically adjusted based on measurements from such in situ plasma monitors. For example, an OES sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, instructions for a controller 1150 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some implementations, instructions for setting one or more reactor parameters may be included in a recipe phase. For example, a first recipe phase may include instructions for setting a flow rate of an inert and/or a precursor gas (e.g., the silicon-containing precursor), instructions for setting a flow rate of a carrier gas (such as argon), and time delay instructions for the first recipe phase. A second, subsequent recipe phase may include instructions for modulating or stopping a flow rate of an inert and/or a precursor gas, and instructions for modulating a flow rate of a carrier or purge gas and time delay instructions for the second recipe phase. A third recipe phase may include instructions for modulating a flow rate of an oxygen-containing reactant gas such as oxygen, instructions for modulating a flow rate of hydrogen gas, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. The fourth recipe, in some implementations, may include instructions for igniting plasma of the oxygen-containing reactant. It will be appreciated that these recipe phases may be further subdivided and/or iterated in any suitable way within the scope of the disclosed implementations.

In certain implementations, the controller 1150 has instructions to perform the operations described in the present disclosure. For example, the controller 1150 may be configured with instructions to perform the following operations: expose a substrate 1112 to a silicon-containing precursor to adsorb onto a surface of the substrate 1112 in the plasma processing chamber 1102, flow hydrogen and oxygen-containing reactant towards the substrate 1112 in the plasma processing chamber 1102, and heat the substrate 1112 to an elevated temperature, where the hydrogen and oxygen-containing reactant react with one another in the plasma processing chamber 1102, where a layer of silicon oxide film is formed on the substrate 1112. In some implementations, the elevated temperature is between about 500° C. and about 650° C. and the oxygen-containing reactant is oxygen. In some implementations, the controller 1150 is further configured with instructions to perform the following operation: deposit one or more additional layers of the silicon oxide film on the substrate 1112 via PEALD in the plasma processing chamber 1102. In some implementations, the controller 1150 configured with instructions for flowing the hydrogen and oxygen-containing reactant is configured with instructions for performing the following operations: flow the oxygen-containing reactant continuously into the plasma processing chamber 1102, and pulse hydrogen at regular intervals into the plasma processing chamber 1102. In some implementations, the controller 1150 may include any of the features described below with respect to system controller 1250 of FIG. 12.

FIG. 12 is a schematic diagram of an example process tool for performing the disclosed implementations. A multi-station processing tool 1200 may include a transfer module 1203. The transfer module 1203 provides a clean, pressurized environment to minimize the risk of contamination of substrates being processed as they are moved between various reactor modules. Mounted on the transfer module 1203 are multi-station reactors 1207, 1208, and 1209, referred to in this context as processing chambers or reactors or tool modules or modules. Each reactor is capable of performing deposition processes such as PEALD, thermal ALD, PECVD, or thermal CVD. One or more of the reactors 1207, 1208, and 1209 may be capable of performing soaking/cleaning, plasma treatment, etching, annealing, or other operations. The reactors 1207, 1208, and 1209 may include multiple stations 1211, 1213, 1215, and 1217 that may sequentially or non-sequentially perform operations in accordance with the disclosed implementations. While a depicted reactor 1207, 1208, or 1209 is depicted with four stations, it will be understood that a reactor according to the present disclosure may have any suitable number of stations. For example, in some implementations, a reactor may have five or more stations, while in other implementations, a reactor may have three or fewer stations. Each station may be configured for deposition by PEALD, thermal ALD, PECVD, or thermal CVD, or configured for different phases of a deposition process. Each station may include a substrate support configured to be heated to an elevated temperature as well as a showerhead or gas inlets for delivering gases.

The multi-station processing tool 1200 also includes one or more substrate source modules 1201 where substrates are stored before and after processing. An atmospheric robot 1204 in the atmospheric transfer chamber 1219 first removes substrates from the one or more substrate source modules 1201 to load locks 1221. While the implementation depicted includes load locks 1221, it will be appreciated that, in some implementations, direct entry of a substrate into a process station may be provided. A substrate transfer device 1205, such as a robot arm unit, in the transfer module 1203 moves the substrates from the load locks 1221 to and among the reactors 1207, 1208, and 1209. This can be done in a pressurized (e.g., vacuum) environment. The multi-station processing tool 1200 may perform one or more of the processes described in the present disclosure as well as other operations such as soaking/cleaning, plasma treatment, annealing, etc. Such processes may be performed in the multi-station processing tool 1200 without introducing a vacuum break.

FIG. 12 may also include a system controller 1250 employed to control process conditions and hardware states of multi-station processing tool 1200. System controller 1250 may include one or more memory devices, one or more mass storage devices, and one or more processors. Processor may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Returning to the implementation of FIG. 12, in some implementations, system controller 1250 controls all of the activities of multi-station processing tool 1200. System controller 1250 executes system control software stored in mass storage device, loaded into memory device, and executed on processor. Alternatively, the control logic may be hard coded in the controller 1250. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1258 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by multi-station processing tool 1200. System control software may be configured in any suitable way. For example, various process tool component subroutines or control objects may be written to control operation of the process tool components necessary to carry out various process tool processes. System control software may be coded in any suitable computer readable programming language.

In some implementations, system control software may include input/output control (IOC) sequencing instructions for controlling the various parameters described above. For example, each phase of a thermal ALD cycle or each phase of a PEALD cycle may include one or more instructions for execution by system controller 1250. The instructions for setting process conditions for an ALD process phase may be included in a corresponding ALD recipe phase. In some implementations, the ALD recipe phases may be sequentially arranged, so that all instructions for an ALD process phase are executed concurrently with that process phase.

Other computer software and/or programs stored on mass storage device and/or memory device associated with system controller 1250 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal and to control the spacing between the substrate and other parts of multi-station processing tool 1200.

A process gas control program may include code for controlling gas composition and flow rates and optionally for flowing gas into one or more process stations prior to deposition in order to stabilize the pressure in the process station. In some implementations, the controller includes instructions for depositing a first silicon oxide layer by thermal ALD in a plasma processing chamber, and depositing a second silicon oxide layer by PEALD in the same plasma processing chamber. In some implementations, the controller includes instructions for depositing a layer of silicon oxide by delivering silicon-containing precursor to a substrate in a dose phase and co-flowing hydrogen and oxygen towards the substrate in a thermal oxidation phase.

A pressure control program may include code for controlling the pressure in the process station by regulating, for example, a throttle valve in the exhaust system of the process station, a gas flow into the process station, etc. In some implementations, the controller includes instructions for providing a chamber pressure in the plasma processing chamber to be at least about 7 Torr prior to performing thermal ALD of silicon oxide layer.

A heater control program may include code for controlling the current to a heating unit that is used to heat the substrate. Alternatively, the heater control program may control delivery of a heat transfer gas (such as helium) to the substrate. In certain implementations, the controller includes instructions for heating the substrate to an elevated temperature during a thermal oxidation phase of a thermal ALD cycle, where the elevated temperature is between about 500° C. and about 650° C.

A plasma control program may include code for setting RF power levels and exposure times in one or more process stations in accordance with the implementations herein. In some implementations, the controller includes instructions for igniting plasma at an RF power level between about 10 W and about 200 W during a thermal oxidation phase of a thermal ALD cycle when hydrogen and oxygen are being co-flowed.

In some implementations, there may be a user interface associated with system controller 1250. The user interface may include a display screen, graphical software displays of the apparatus and/or process conditions, and user input devices such as pointing devices, keyboards, touch screens, microphones, etc.

In some implementations, parameters adjusted by system controller 1250 may relate to process conditions. Non-limiting examples include process gas composition and flow rates, temperature, pressure, plasma conditions (such as RF power levels and exposure times), etc. These parameters may be provided to the user in the form of a recipe, which may be entered utilizing the user interface.

Signals for monitoring the process may be provided by analog and/or digital input connections of system controller 1250 from various process tool sensors. The signals for controlling the process may be output on the analog and digital output connections of multi-station processing tool 1200. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1250 may provide program instructions for implementing the above-described deposition processes. The program instructions may control a variety of process parameters, such as DC power level, RF bias power level, pressure, temperature, gas flow composition, flow rates, etc. The instructions may control the parameters to operate thermal ALD or thermal CVD of silicon oxide film according to various implementations described herein.

The system controller 1250 will typically include one or more memory devices and one or more processors configured to execute the instructions so that the apparatus will perform a method in accordance with the disclosed implementations. Machine-readable, non-transitory media containing instructions for controlling process operations in accordance with the disclosed implementations may be coupled to the system controller.

The various hardware and method implementations described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing a silicon oxynitride film, the method comprising:
    providing a substrate in a plasma processing chamber;
    depositing a first silicon oxynitride layer on a substrate via thermal atomic layer deposition (thermal ALD) in the plasma processing chamber, wherein the first silicon oxynitride layer is deposited by thermal oxidation and nitridation, wherein depositing the first silicon oxynitride layer by thermal ALD comprises:
        heating the substrate to an elevated temperature, wherein the elevated temperature is between 550° C. and 650° C.;
        exposing the substrate to an aminosilane precursor to adsorb onto a surface of the substrate; and
        exposing the substrate to an oxygen-containing reactant while the substrate is heated to the elevated temperature to drive a reaction between the oxygen-containing reactant and the aminosilane precursor to form the first silicon oxynitride layer; and
    depositing a second silicon oxynitride layer on the substrate via plasma-enhanced atomic layer deposition (PEALD) in the plasma processing chamber, wherein the second silicon oxynitride layer is deposited by plasma oxidation and nitridation.

2. The method of claim 1, wherein the oxygen-containing reactant includes oxygen ($O_2$), ozone ($O_3$), hydrogen peroxide ($H_2O_2$), water ($H_2O$), or combinations thereof.

3. The method of claim 1, wherein a chamber pressure in the plasma processing chamber is equal to or greater than about 7 Torr.

4. The method of claim 1, wherein exposing the substrate to an oxygen-containing reactant comprises:
    flowing hydrogen ($H_2$) and oxygen ($O_2$) towards the substrate in the plasma processing chamber while the substrate is heated at the elevated temperature, wherein the hydrogen and oxygen react within the plasma processing chamber, wherein the first silicon oxynitride layer is formed on the substrate.

5. The method of claim 1, wherein depositing the second silicon oxynitride layer by PEALD comprises:
    exposing the substrate to an aminosilane precursor to adsorb onto a surface of the substrate; and
    exposing the substrate to plasma generated from a second oxygen-containing reactant, wherein the plasma drives a reaction between reactive species of the second oxygen-containing reactant and the aminosilane precursor to form the second silicon oxynitride layer.

6. The method of claim 5, further comprising:
    exposing the substrate to plasma generated from a nitrogen-containing reactant to form the second silicon oxynitride layer.

7. The method of claim 1, further comprising:
    depositing a silicon nitride layer on the first and second silicon oxynitride layer by thermal ALD or PEALD in the plasma processing chamber.

8. A method of depositing silicon oxynitride film, the method comprising:
    heating a substrate to an elevated temperature, wherein the elevated temperature is between 550° C. and 650° C.;
    exposing the substrate to an aminosilane precursor to adsorb onto a surface of the substrate in a plasma processing chamber; and
    flowing hydrogen ($H_2$) and an oxygen-containing reactant towards the substrate in the plasma processing chamber, wherein the hydrogen and the oxygen-containing reactant react within the plasma processing chamber, wherein a layer of a silicon oxynitride film is formed on the substrate by thermal oxidation and nitridation at the elevated temperature.

9. The method of claim 8, wherein the hydrogen and the oxygen-containing reactant react in situ with one another within the plasma processing chamber in an exothermic reaction and drive formation of the layer of the silicon oxynitride film.

10. The method of claim 8, wherein a chamber pressure of the plasma processing chamber is equal to or greater than about 7 Torr.

11. The method of claim 8, wherein the oxygen-containing reactant includes oxygen ($O_2$) or ozone ($O_3$).

12. The method of claim 8, further comprising:
applying plasma power to the plasma processing chamber to ignite plasma generated from the hydrogen and oxygen-containing reactant in the plasma processing chamber.

13. The method of claim 12, wherein the plasma power applied to the plasma processing chamber is between about 10 W and about 200 W.

14. The method of claim 8, wherein flowing the hydrogen and the oxygen-containing reactant comprises:
flowing the oxygen-containing reactant continuously into the plasma processing chamber; and
pulsing the hydrogen at regular intervals into the plasma processing chamber.

15. The method of claim 8, wherein (i) exposing the substrate to the aminosilanes precursor and (ii) flowing the hydrogen and oxygen-containing reactant are performed cyclically in a thermal atomic layer deposition (thermal ALD) process.

16. The method of claim 8, further comprising:
purging the plasma processing chamber after exposing the substrate to the aminosilane precursor and before flowing the hydrogen and oxygen-containing reactant; and
purging the plasma processing chamber after flowing the hydrogen and oxygen-containing reactant.

17. The method of claim 8, wherein (i) exposing the substrate to the aminosilane precursor and (ii) flowing the hydrogen and oxygen-containing reactant are performed continuously in a thermal chemical vapor deposition (thermal CVD) process.

18. The method of claim 8, further comprising:
depositing one or more additional layers of the silicon oxynitride film on the substrate via PEALD in the plasma processing chamber.

19. The method of claim 8, further comprising:
depositing one or more layers of a silicon nitride film on the layer of the silicon oxynitride film by thermal ALD or PEALD in the plasma processing chamber.

20. The method of claim 8, further comprising:
exposing the substrate to plasma of a nitrogen-containing reactant to form the layer of the silicon oxynitride film.

21. The method of claim 8, wherein flowing hydrogen and the oxygen-containing reactant comprises:
generating oxygen radicals from the oxygen-containing reactant in a remote plasma source;
introducing the oxygen radicals into the plasma processing chamber; and
flowing the hydrogen into the plasma processing chamber.

* * * * *